United States Patent
Fujii et al.

(10) Patent No.: US 6,564,367 B1
(45) Date of Patent: May 13, 2003

(54) LOGIC DIVIDING METHOD, LOGIC DIVIDING SYSTEM AND RECORDING MEDIUM FOR STORING LOGIC DIVIDING PROGRAM

(75) Inventors: Mototsugu Fujii, Ebina (JP);
Kazunobu Morimoto, Zama (JP);
Osamu Tada, Hadano (JP)

(73) Assignee: Hitachi, Ltd., Tokyo (JP)

( * ) Notice: Subject to any disclaimer, the term of this patent is extended or adjusted under 35 U.S.C. 154(b) by 249 days.

(21) Appl. No.: 09/619,636

(22) Filed: Jul. 19, 2000

(30) Foreign Application Priority Data

Jul. 22, 1999 (JP) ............................................. 11-207225

(51) Int. Cl.7 .............................................. G06F 17/50
(52) U.S. Cl. .......................................... 716/16; 703/23
(58) Field of Search ............................... 716/16; 703/23

(56) References Cited

U.S. PATENT DOCUMENTS 5,875,116 A * 2/1999 Oguma et al. ................. 716/16
5,911,061 A * 6/1999 Tochio et al. ................. 703/23

FOREIGN PATENT DOCUMENTS

| JP | 6-3414 | 1/1994 |
| JP | 8-212249 | 8/1996 |
| JP | 10-312309 | 11/1998 |

* cited by examiner

Primary Examiner—John F. Niebling
Assistant Examiner—Stacy Whitmore
(74) Attorney, Agent, or Firm—Mattingly, Stanger & Malur, P.C.

(57) ABSTRACT

Logic emulation according to the present invention is aimed at an object to provide a logic dividing and module wiring system for operating logic related to external interface signals and interface signals among circuits obtained as a result of division or a logic circuit at a high speed. In a logic emulation system, information on assignments of external interface signals of logic to connector pins is read in during division of the logic. Logic related to an external interface signal assigned to a connector pin is assigned to a field programmable gate array directly connected to the connector pin. In addition, delays are checked after the division of a logic circuit in order to determine the level of delay criticality of each interface signal between field programmable gate arrays. Wiring of a module is then carried out in accordance with the levels of criticality.

27 Claims, 18 Drawing Sheets

FIG. 4

```
MODULE TYPEA                                    ···FIRST LINE
  DEVICE FPGA FPGAα                             ···SECOND LINE
  DEVICE FPGA FPGAβ                             ···THIRD LINE
  DEVICE FPGA FPGAγ                             ···FOURTH LINE
  DEVICE SWITCH SWITCHα                         ···FIFTH LINE
  DEVICE SWITCH SWITCHβ                         ···SIXTH LINE
  DEVICE SWITCH SWITCHγ                         ···SEVENTH LINE
  DEVICE CONNECTOR CONNECTORα                   ···EIGHTH LINE
  DEVICE CONNECTOR CONNECTORβ                   ···NINTH LINE
  DEVICE CONNECTOR CONNECTORγ                   ···TENTH LINE
  DEF_PIN FPGA                                  ···11TH LINE
    A0,A1,A2,.................A15               ···12TH LINE
  DEF_PIN SWITCH                                ···13TH LINE
    P0,P1,P2,.................P12               ···14TH LINE
  DEF_PIN CONNECTOR                             ···15TH LINE
    C0,C1,C2,.................C6                ···16TH LINE
  WIRE DW1 FPGAα/A0 FPGAγ/A4                    ···17TH LINE
  WIRE DW2 FPGAα/A1 FPGAγ/A5                    ···18TH LINE
    ............
  WIRE DWC1 FPGAα/A13   CONNECTORα/C0           ···19TH LINE
  WIRE DWC1 FPGAα/A14   CONNECTORα/C1           ···20TH LINE
  WIRE DWC1 FPGAα/A15   CONNECTORα/C2           ···21ST LINE
  WIRE SC1    SWITCHα/P0 CONNECTORα/C2          ···22ND LINE
  WIRE SC1    SWITCHα/P9 CONNECTORα/C2          ···23RD LINE
  WIRE SC1    SWITCHα/P9 CONNECTORα/C2          ···24TH LINE
  WIRE SC1    SWITCHα/P9 CONNECTORα/C2          ···25TH LINE
    ............
END MODULE                                      ···26TH LINE
```

| | | |
|---|---|---|
| K | CONNECTOR α /C0 | ···FIRST LINE |
| A | CONNECTOR α /C1 | |
| B | CONNECTOR α /C2 | |
| D | CONNECTOR α /C5 | |
| C | CONNECTOR α /C6 | |
| L | CONNECTOR β /C0 | |
| M | CONNECTOR β /C1 | |
| CLK | CONNECTOR β /C3 | |
| E | CONNECTOR γ /C0 | |
| F | CONNECTOR γ /C1 | |
| G | CONNECTOR γ /C2 | |
| H | CONNECTOR γ /C3 | |
| I | CONNECTOR γ /C4 | |
| J | CONNECTOR γ /C5 | |

FIG. 7

| | | | |
|---|---|---|---|
| BOARD SYSTEMA | | | ···FIRST LINE |
| DEVICE | LSIA | LSI_A | ···SECOND LINE |
| DEVICE | LSIB | LSI_B | ···THIRD LINE |
| DEVICE | TYPEA | Logic | ···FOURTH LINE |
| DEVICE | CLKGEN | Clock | ···FIFTH LINE |
| DEVICE | MEMORY | Mem | ···SIXTH LINE |
| NET | A | LSI_A,Logic,LSI_B | ···SEVENTH LINE |
| NET | B | LSI_A,Logic | ···EIGHTH LINE |
| NET | C | LSI_A,Logic | ···NINTH LINE |
| ............ | | | |
| NET | K | Logic,LSI_A | ···TENTH LINE |
| NET | L | Logic,Mem | ···11TH LINE |
| NET | M | Logic,Mem | ···12TH LINE |
| ............ | | | |
| END BOARD | | | ···13TH LINE |

FIG. 8

| | | |
|---|---|---|
| CONNECOR | CONNECTOR α | ···FIRST LINE |
| C0 DWC1 | FPGA α | ···SECOND LINE |
| C1 DWC2 | FPGA α | ···THIRD LINE |
| C2 DWC3 | FPGA α | ···FOURTH LINE |
| C3 DWC4 | SWITCH α | ···FIFTH LINE |
| C4 DWC5 | SWITCH α | ···SIXTH LINE |
| C5 DWC6 | SWITCH α | ···SEVENTH LINE |
| C6 DWC7 | SWITCH α | ···EIGHTH LINE |
| CONNECOR | CONNECTOR β | ···NINTH LINE |
| .................. | | |

FIG. 9

| | | |
|---|---|---|
| PG1 | A,B,C,D,K | ···FIRST LINE |
| PG2 | L,M | ···SECOND LINE |
| PG3 | E,F,G,H,I,J | ···THIRD LINE |
| PG4 | CLK | ···FOURTH LINE |

FIG. 10

| | | | | |
|---|---|---|---|---|
| CELL | BUF | TYPE | BUFFER | ···FIRST LINE |
| ARC | IN | OUT | 2ns | ···SECOND LINE |
| CELL | INV | TYPE | INVERYER | ···THIRD LINE |
| ARC | IN | OUT | 1ns | ···FOURTH LINE |
| CELL | TRI | TYPE | TRI-STATE-BUFFER | ···FIFTH LINE |
| ARC | EN | OUT | 2ns | ···SIXTH LINE |
| ARC | IN | OUT | 1ns | ···SEVENTH LINE |
| CELL | 2AND | TYPE | AND | ···EIGHTH LINE |
| ARC | IN1 | OUT | 2ns | ···NINTH LINE |
| ARC | IN2 | OUT | 3ns | ···TENTH LINE |
| CELL | 2OR | TYPE | OR | ···11TH LINE |
| ARC | IN1 | OUT | 3ns | ···12TH LINE |
| ARC | IN2 | OUT | 4ns | ···13TH LINE |
| CELL | DFF | TYPE | FF | ···14TH LINE |
| ARC | CK | O | 5ns | ···15TH LINE |

| | | | | | | | |
|---|---|---|---|---|---|---|---|
| L | B13 | FF10 | | | | | ···FIRST LINE |
| M | B14 | FF11 | | | | | ···SECOND LINE |
| K | B12 | G5 | FF3 | FF10 | | | ···THIRD LINE |
| A | B1 | FF1 | | | | | ···FOURTH LINE |
| B | B2 | G16 | G2 | FF2 | | | ···FIFTH LINE |
| D | B5 | FF4 | B4 | FF6 | G3 | FF5 | FF2 | ···SIXTH LINE |
| C | B3 | G2 | FF2 | G1 | G4 | FF3 | ···SEVENTH LINE |
| E | B6 | G6 | G7 | G8 | FF5 | G10 | G2 | FF2 | ···EIGHTH LINE |
| F | B7 | G7 | G8 | FF5 | G10 | FF7 | ···NINTH LINE |
| G | B8 | G10 | FF7 | G11 | G12 | FF9 | ···TENTH LINE |
| H | B9 | G11 | G12 | FF9 | | | ···11TH LINE |
| I | B10 | G12 | FF9 | | | | ···12TH LINE |
| J | B11 | G14 | FF8 | | | | ···13TH LINE |

FIG. 12

| | | |
|---|---|---|
| L | 15 | ···FIRST LINE |
| M | 14.5 | ···SECOND LINE |
| K | 12 | ···THIRD LINE |
| A | 11.5 | ···FOURTH LINE |
| B | 10 | ···FIFTH LINE |
| D | 9 | ···SIXTH LINE |
| C | 7 | ···SEVENTH LINE |
| E | 6.5 | ···EIGHTH LINE |
| F | 6 | ···NINTH LINE |
| G | 5.5 | ···TENTH LINE |
| H | 5 | ···11TH LINE |
| I | 4 | ···12TH LINE |
| J | 2 | ···13TH LINE |
| CLK | EX | ···14TH LINE |

FIG. 13

| | |
|---|---|
| CONNECTOR α | ···FIRST LINE |
|     A,B,C,D,K | ···SECOND LINE |
| CONNECTOR β | ···THIRD LINE |
|     L,M,CLK | ···FOURTH LINE |
| CONNECTOR γ | ···FIFTH LINE |
|     E,F,G,H,I,J | ···SIXTH LINE |

FIG. 14

| | |
|---|---|
| K | CONNECTOR α /C0 |
| A | CONNECTOR α /C1 |
| B | CONNECTOR α /C2 |
| L | CONNECTOR β /C0 |
| M | CONNECTOR β /C1 |
| E | CONNECTOR γ /C0 |
| F | CONNECTOR γ /C1 |
| G | CONNECTOR γ /C2 |

FIG. 15

| FPGA α | B12 | G5 | FF3 | B1 | FF1 | B2 | G16 | G2 | FF2 | | | ...FIRST LINE |
| FPGA β | B13 | FF10 | B14 | FF11 | | | | | | | | ...SECOND LINE |
| FPGA γ | B6 | G6 | G7 | G8 | FF5 | B7 | G10 | FF7 | B8 | G11 | G12 | FF9 | ...THIRD LINE |

| Clock | T0 | CLK | | ···FIRST LINE |
| --- | --- | --- | --- | --- |
| | T0 : T0 | = | 20ns | ···SECOND LINE |
| | T0 : PAD | = | 11ns | ···THIRD LINE |
| | PAD : T0 | = | 9ns | ···FOURTH LINE |

FIG. 18

| | | |
|---|---|---|
| N19 | 0 | ···FIRST LINE |
| N30 | 1 | ···SECOND LINE |
| N18 | 5 | ···THIRD LINE |
| N16 | 7 | ···FOURTH LINE |
| N24 | 11 | ···FIFTH LINE |
| N35 | 11 | ···SIXTH LINE |
| N28 | 12 | ···SEVENTH LINE |
| N35 | 13 | ···EIGHTH LINE |

FIG. 19

| | | |
|---|---|---|
| K | DWC1 | ···FIRST LINE |
| A | DWC2 | ···SECOND LINE |
| B | DWC3 | ···THIRD LINE |
| D | SC3, FS1 | ···FOURTH LINE |
| C | SC4, FS2 | ···FIFTH LINE |
| L | DWC4 | ···SIXTH LINE |
| M | DWC5 | ···SEVENTH LINE |
| CLK | SC5, FS4, FS13, FS22 | ···EIGHTH LINE |
| E | DWC7 | ···NINTH LINE |
| F | DWC8 | ···TENTH LINE |
| G | DWC9 | ···11TH LINE |
| H | SC9, FS25 | ···12TH LINE |
| I | SC10, FS26 | ···13TH LINE |
| J | SC11, FS27 | ···14TH LINE |
| N19 | DW1 | ···15TH LINE |
| N30 | DW3 | ···16TH LINE |
| N18 | DW4 | ···17TH LINE |
| N16 | FS5, FS14, FS23 | ···18TH LINE |
| N24 | DW5 | ···19TH LINE |
| N35 | DW6 | ···20TH LINE |
| N28 | FS10, FS19 | ···21ST LINE |
| N14 | DW2 | ···22ND LINE |

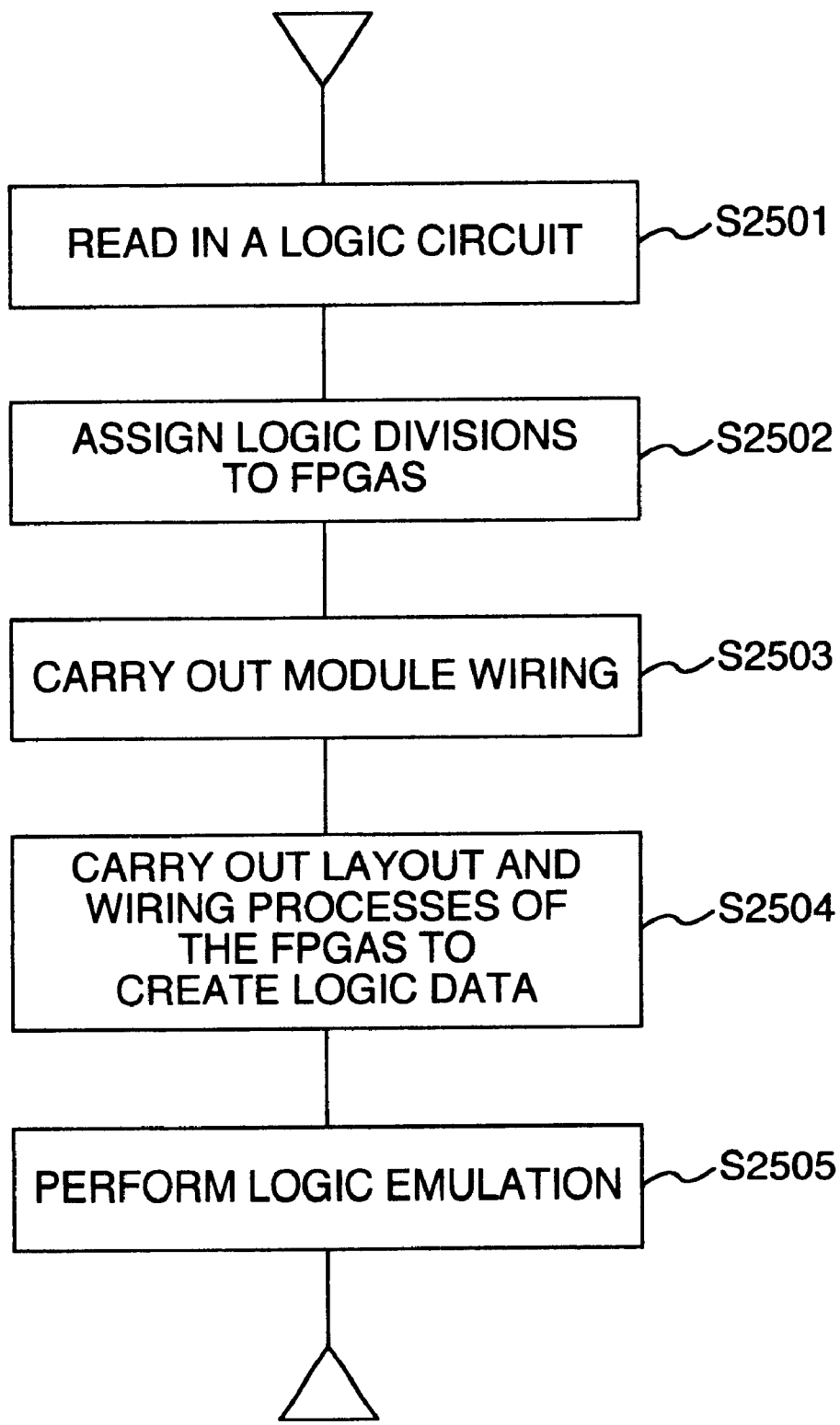

LOGIC DIVIDING METHOD, LOGIC DIVIDING SYSTEM AND RECORDING MEDIUM FOR STORING LOGIC DIVIDING PROGRAM

CROSS-REFERENCE TO RELATED APPLICATIONS

The present invention is related to (1) U.S. Pat. No. 5,875,116 issued Feb. 23, 1999, (2) U.S. Pat. No. 5,911,061 issued Jun. 8, 1999 and (3) U.S. patent application Ser. No. 09/328,800 filed Jun. 9, 1999.

BACKGROUND OF THE INVENTION

In general, the present invention relates to a logic dividing method for assigning logic circuits to a module with a plurality of programmable large-scale integrated circuits (LSIs) mounted thereon and relates to a module wiring technology in a logic emulation system for verifying performance and operations of the large-scale integrated circuits. More particularly, the present invention relates to an effective technology applicable to a logic dividing and module wiring system which takes a positional relation with an external interface of a module and operation timings into consideration.

In development of a large-scale integrated circuit which is referred to hereafter as an LSI, it is important that as many defects as possible are detected before a prototype is built. This is because, if a defect is detected after a prototype is built, it will take time to determine a cause of the defect. In addition, since the prototype must be rebuilt if a defect is detected, it is feared that the cost and the development time will increase.

As a solution to the problem, there is logic emulation using a field programmable gate array (which is referred to hereafter as an FPGA) for a programmable large-scale integration circuit. In the logic emulation, a logic circuit to be verified is programmed by using an FPGA and logic of the circuit is verified by actually operating the FPGA in conjunction with an actual product sold in the market or an existing LSI.

In addition, with logic of a logic circuit to be processed becoming large in scale in recent years, the logic circuit is divided into a plurality of FPGAs each serving as a target of circuit implementation. Then, the FPGAs are assembled for carrying out logic emulation.

As logic emulation apparatus for carrying out such logic emulation, there is a technology disclosed in Japanese Patent Laid-open No. Hei 6-3414. According to this technology, logic emulation is carried out by using a module which is called a pseudo LSI and comprises a plurality of FPGAs, a non-volatile memory for storing data of a logic circuit to be verified, a transfer unit for transferring data between the FPGAs and the non-volatile memory and a power supply. As a method to implement such a module, a plurality of FPGAs are mounted on the module as bare chips. Such a module is referred to as a multi-chip module.

In addition, as a typical technique for carrying out logic emulation whereby a logic circuit is divided, being targeted at a plurality of FPGAs and the FPGAs are assembled, a technology is disclosed in a document such as Japanese Patent Laid-open No. Hei 10-312309. As a technique for dividing a logic circuit into a plurality of portions, a technology is disclosed in Japanese Patent Laid-open No. Hei 8-212249.

By referring to a flowchart shown in FIG. 25, the following description briefly explains work and processing to generate logic data for logic emulation which uses a logic emulation apparatus disclosed in Japanese Patent Laid-open No. Hei 6-3414, and adopts the logic-emulation technique disclosed in Japanese Patent Laid-open No. Hei 10-312309 as well as the logic-circuit dividing technique disclosed in Japanese Patent Laid-open No. Hei 8-212249.

As shown in FIG. 25, the flowchart begins with a step S2501 at which a logic circuit subjected to logic emulation is input. Then, at the next step S2502, the logic circuit input at the step S2501 is divided, being targeted at a plurality of FPGAs. That is to say, results of the division are each assigned to one of the FPGAs. Then, at the next step S2503, the FPGAs are wired on a module for programming the logic circuit input at S2501. In actuality, since wiring on the module has been done, pins of each of the FPGAs are associated with logic signals. Then, at the next step S2504, in accordance with results of assignment of portions resulting from the division of the logic circuit at the step S2502 to the FPGAs and pin positions determined at the step S2503, placement and wiring of the FPGAs are carried out to create logic data. Finally, at the step S2505, logic emulation is carried out by programming the logic data created at the step S2504 on the FPGAs on the module.

As one of problems encountered in such logic emulation, in a module where the LSI under development and the logic circuit are programmed to operate, the package size, the connection structure and the pin layout vary. Thus, there is raised a problem of a need to individually create both a board for mounting an LSI to be developed and a board for mounting the module described above.

It takes time to create a board for mounting the module described above. In addition, the logic circuit which is programmed on the module and serves as an object of logic verification needs to be connected to another LSI to be actually operated in conjunction with the logic circuit. Thus, the board is created concurrently with the work to design and to divide the logic circuit in many cases. For these reasons, at a point of time the logic circuit is divided, external interface signals of the logic may have been assigned to pins of each connector on the module or assigned to connectors at a connector level even if not assigned to pins of each of the connectors.

In the conventional technology described above, however, the design of a board is not taken into consideration when the logic circuit is divided. Thus, a variety of problems are raised in implementing the logic emulation.

For example, the conventional technology does not consider which connector on the module external interface signals of the logic are to be assigned to when the logic circuit is divided. As a result, there is raised a problem of unavoidable diversion of logic related to external interface signals independent of results of the division and the assignment of the external interface signals to connector pins.

This problem is described in concrete terms as follows. The module described in Japanese Patent Laid-open No. Hei 6-3414 comprises a connector, FPGAs, wires connecting the connector to one or more FPGAs and wires connecting two or more FPGAs.

With an external interface signal assigned to a wire connecting a connector to two or more FPGAs, the external interface signal is propagated to pins of all the FPGAs connected to the connector by the wire. Thus, a pin of any of the FPGAs not logically using the external interface signal becomes unnecessary and other necessary logic signals can not be assigned. If a number of such wires are used, the number of virtually usable pins in each FPGA becomes small. Thus, the number of wires connecting a connector pin to an FPGA on a 1-to-1 basis increases. This holds true of wires connecting an FPGA to another. With a connector pin connected to an FPGA on a 1-to-1 basis, it is desirable to assign logic related to an external interface signal assigned to a connector pin to an FPGA connected to the connector pin if the operating speed of the logic or a wire resource on the module is taken into consideration.

To put it more concretely, assume that external interface signals A and B have been assigned to two pins of a connector directly connected to the same FPGA on the module. In this case, it is desirable to assign logic related to the external interface signals A and B to the FPGA directly connected to the connector as described above.

Since the positions of connector pins are not taken into consideration when logic is divided in accordance with the conventional technology described above, the external interface signals A and B may be assigned to different FPGAs in some cases. In this case, one of the external interface signals A and B is connected directly to logic in another FPGA from a connector by way of an FPGA directly connected to the connector. As a result, there is raised a problem of a reduced operating speed.

In addition, the following problem is also raised. If a logic circuit is divided, a critical-delay path may also be divided into segments assigned to a plurality of FPGAs in some cases. A path is a route of propagation of a signal in logic. For example, a path starts at a flip-flop and ends at another flip-flop, comprising a net and gates through which a signal is propagated. In this case, it is desirable to assign the net between FPGAs which serves as an element of a critical-delay path to a wire directly connecting the FPGAs as a first priority. According to the conventional technology, however, a delay is not taken into consideration in the wiring work. Thus, a wire directly connecting two FPGAs can not be used as a critical-delay path passing through the FPGAs. That is to say, the critical-delay path passing through the two FPGAs must be implemented by a wire connecting the two FPGAs by way of another FPGA. As a result, there is raised a problem of a reduced operating speed in some cases.

SUMMARY OF THE INVENTION

It is thus an object of the present invention addressing the problems described above to provide a logic dividing and module wiring system for operating logic related to external interface signals and interface signals among circuits obtained as a result of division or a logic circuit at a high speed.

The applicant for a patent of the present invention has completed separate patent application processes, namely, Japanese Patent Laid-open No. Hei 10-161813 in Japan and a U.S. patent application Ser. No. 09/328,800 in the US, for an invention solving the problem of a need to individually create both a board for mounting an LSI to be developed and a board for mounting the module for logic emulation. The invention according to the above completed applications provides a means for carrying out logic emulation. The means is provided with a module, a module connector serving as a connection facility for the module and a terminal land for mounting an LSI under development. On one surface or both the surfaces of the module, there are mounted at least an FPGA used for implementing logic operations by programming logic data and at least one switch device allowing connections among circuits to be programmed. The module connector is used for electrically connecting the module to an external device. The module includes wires directly connecting the FPGAs to the module connector and wires connecting FPGAs to the module connector through the switch devices. The means carries logic emulation by using a board connected to the terminal land using a board connector on a 1-to-1 basis and actually mounting an LSI under development on the board by connecting the module connector to the board connector.

A problem of logic related to an external interface signal not operating on the module at a high speed may be raised when a logic emulation technique according to the conventional technology is adopted in implementation of the module according to the conventional technology and the module in a process of application for a patent as described in Japanese Patent Laid-open No. Hei 10-161813. In order to solve this problem, the logic dividing and module wiring system provided by the present invention employs the following means.

First of all, the present invention presents a logic emulation system for operating a logic circuit through execution of the steps of:

using a module on which a plurality of FPGAs and a plurality of input/output connectors are mounted and interconnected directly or through switch devices by wires in advance like the one disclosed in Japanese Patent Laid-open No. Hei 10-161813;

dividing the logic circuit into a plurality of circuits;

assigning each of the circuits obtained as a result of the division of the logic circuit to one of the FPGAs; and assigning interface signals among the circuits obtained as a result of the division of the logic circuit to wires on the module, wherein extracted pieces of logic are assigned to FPGAs connected directly to pins of the connectors on the module on the basis of first information, second information and third information where:

the first information is information on assignments of external interface signals of logic to the connectors;

the second information is information on logic related to the external interface signals of logic; and the third information is information on wires connecting the connectors to the FPGAs on the module.

It should be noted that, in order to determine the assignment of external interface signals of logic to connector pins, as information on a board on which the module is to be mounted, typically, a net list of the board is acquired, and external interface signals of logic connected to the same part on the module are grouped and assigned to the same connector. In addition, for each external interface signal, as information on priority of pin assignment, criticality is acquired to be used typically as an indicator as to how critical a delay is and the assignment of connector pins is determined on the basis of the criticality of the delay.

Furthermore, in order to obtain information on logic related to external interface signals, logic using the external interface signals on the logic circuit is traced by using gate definition information describing, among other data, connection of each gate on the logic circuit. An example of the gate definition information is a gate library. A result of the tracing can also be used as the second information.

Moreover, for a net spread over a plurality of FPGAs as a result of logic division, a delay of an external interface signal between FPGAs of a net is computed for each net and wiring of the module is carried out in accordance with the criticality of each delay.

In the division of a logic circuit according to a logic dividing method provided by the present invention, an associative relation determining assignments of external interface signals of logic to connector pins in advance is acquired and pieces of logic related to the external interface signals are assigned to FPGAs which are wired to connector pins on a 1-to-1 basis. Thus, an external interface signal does not pass through an unrelated FPGA along a path starting from a connector pin and ending at an FPGA to which logic related to the external interface signal is assigned. As a result, the logic emulation can be carried out at a high speed.

In addition, according to the logic dividing method provided by the present invention, wiring is carried out in accordance with a priority order determined by the criticality of a transmission delay incurred by an interface signal propagating along each of paths each connecting a plurality of FPGAs to each other with the highest priority assigned to the most critical delay. As a result, a path with a critical transmission delay does not pass through an unnecessary FPGA, making it possible to operate the module at a high speed.

As described above, when a logic circuit is divided in accordance with the present invention, an assignment reading means reads in assignments of external interface signals of logic to connector pins;

logic extracting means extracts pieces of logic related to the external interface signals of the logic; and the pieces of logic extracted by the logic extracting means are assigned to FPGAs directly connected to the connector pins in accordance with the assignment of the external interface signals of the logic to the connector pins read in by the assignment reading means.

By doing so using the means described above, logic which is programmed on a module and related to an external interface signal can be operated at a high speed.

In addition, there are also provided:

a means for checking delays after dividing a logic circuit and determining criticality of each of the delays according to a priority order of interface signals between FPGAs; and a means for implementing wiring on a module in accordance with the criticality of each of the delays.

Thus, it is possible to prevent a slowdown of the operation of an interface signal between FPGAs which serves as an element of a path with a critical delay. As a result, the logic emulation can be operated at a high speed.

BRIEF DESCRIPTION OF THE DRAWINGS

FIG. 4 is a diagram showing a typical wire connection information file 103;

FIG. 7 is a diagram showing a typical board net list 108;

FIG. 8 is a diagram showing a typical connector connection information file 105;

FIG. 9 is diagram showing a typical external interface group list 110;

FIG. 10 is a diagram showing a typical gate library 111;

FIG. 11 is a diagram showing a typical trace result file 113;

FIG. 12 is a diagram showing a typical external interface priority specification file 114;

FIG. 13 is a diagram showing a typical connector-signal association list 115;

FIG. 14 is a diagram showing a typical connector-pin assignment result file 117;

FIG. 15 is a diagram showing a typical division initial state file 118;

FIG. 18 is a diagram showing a typical inter-division-result interface priority order file 123;

FIG. 19 is a diagram showing a typical wiring result file 125;

FIG. 25 shows a flowchart representing logic emulation.

DETAILED DESCRIPTION OF THE EMBODIMENT

An embodiment of the present invention is explained as follows.

Figure 1:
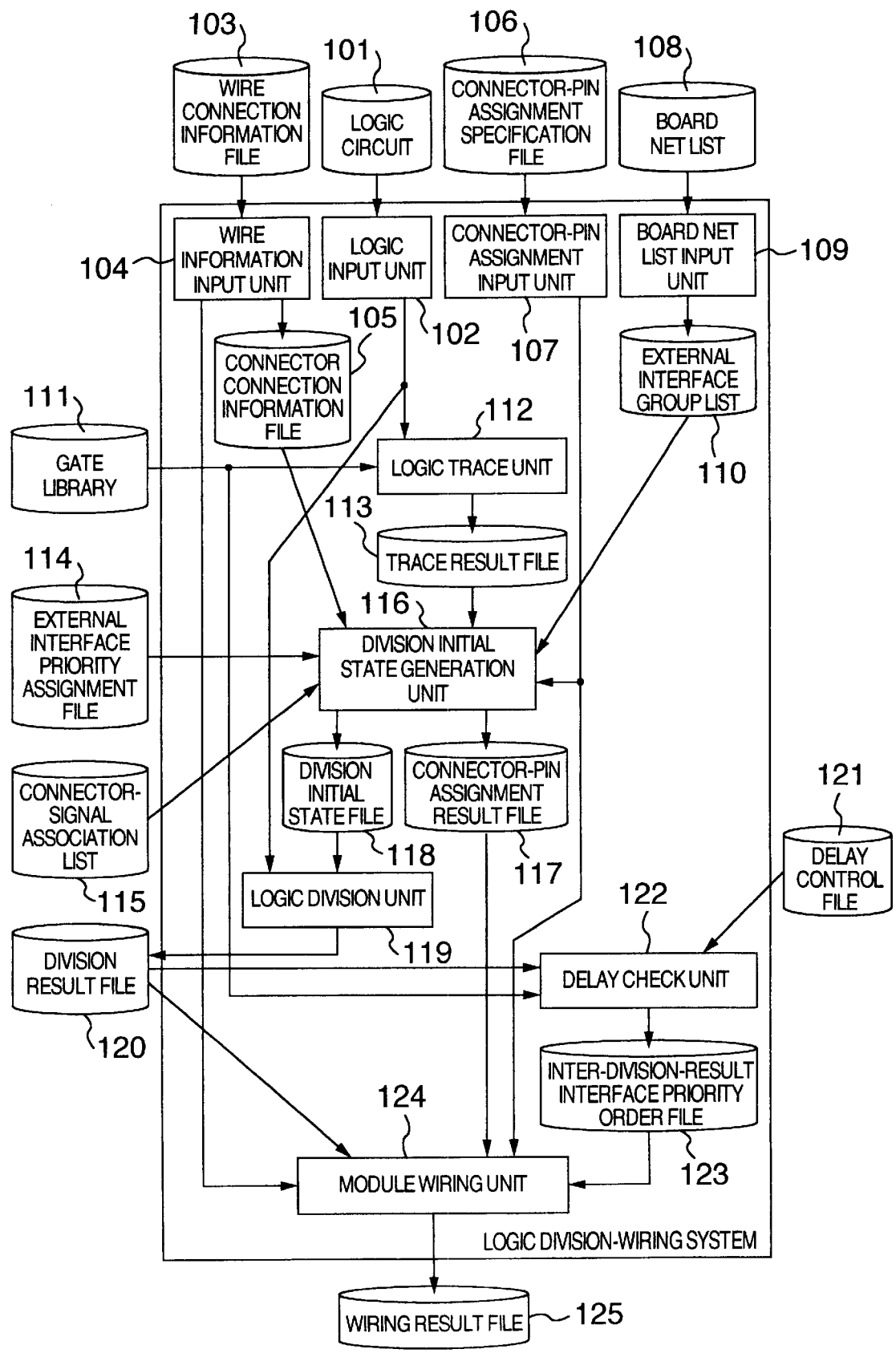
FIG. 1 is a diagram showing the configuration of a logic dividing and module wiring system provided by the present invention.

FIG. 1 is a diagram showing the configuration of a logic dividing and module wiring system provided by the present invention. The configuration of the logic dividing and module wiring system is described as follows.

In FIG. 1, reference numeral 101 denotes a logic circuit serving as an input to the logic dividing and module wiring system and reference numeral 102 denotes a logic input unit for carrying out processing to input the logic circuit 101 to the logic dividing and module wiring system. Reference numeral 103 denotes a wire connection information file representing relations of wire connections on a module on which a plurality of FPGAs and a plurality of input/output connectors are mounted and interconnected directly or through switch devices by wires in advance. Reference numeral 104 denotes a wire information input unit for carrying out processing to read in the connection information file 103 and extracting relations of connections of wires connected to a connector. Reference numeral 105 denotes a connector connection information file for storing results of the processing carried out by the wire information input unit 104.

Reference numeral 106 denotes a connector-pin assignment specification file describing assignments of external interface signals of logic to connector pins. Reference numeral 107 denotes a connector-pin assignment input unit for carrying out processing to read in the connector-pin assignment specification file 106.

Reference numeral 108 denotes a board net list representing connections of parts mounted on a board on which the module is also mounted. Reference numeral 109 denotes a board net list input unit for carrying out processing to read in the board net list 108 and collect external interface signals of the logic circuit 101 connected to the same part according to the board net list 108. Reference numeral 110 denotes an external interface group list for storing results of the processing to collect external interface signals of the logic circuit 101 connected to the same part according to the board net list 108.

Reference numeral 111 denotes a gate library describing the gate name, the gate type and the signal transfer route inside the gate between input and output pins as well as the transfer delay time of the route for each gate employed in the logic circuit 101.

Reference numeral 112 denotes a logic trace unit for inputting the logic circuit 101 and the gate library 111, tracing a path of an external interface signal of the logic circuit 101 to a memory device and storing a trace result for each external interface signal. Reference numeral 113 denotes a trace result file for storing a result of tracing a path of an external interface signal of the logic circuit 101 to a memory device for each external interface signal.

Reference numeral 114 denotes an external interface priority specification file for specifying an external interface signal of the logic circuit 101 along with a criticality of the delay.

Reference numeral 115 denotes a connector-signal association list assigning signals to a connector on the module for each connector. If the connector-pin assignment specification file 106 and the board net list 108 exist as two connector-signal association lists 115, the user specifies one of them.

Reference numeral 116 denotes a division initial state generation unit for generating an initial state of division processing by inputting the connector connection information file 105, the trace result file 113, the external interface priority specification file 114 and the connector-pin assignment specification file 106 or the external interface group list 110 or the connector-signal association list 115. Reference numeral 117 denotes a connector-pin assignment result file describing assignments of external interface signals of logic to connector pins which are output by the division initial state generation unit 116. Reference numeral 118 denotes a division initial state file describing assignments of parts to FPGAs of logic related to external interfaces.

Reference numeral 119 denotes a logic dividing unit for carrying out processing to divide the logic circuit 101 in accordance with the division initial state file 118.

Reference numeral 120 denotes a division result file describing a plurality of circuits obtained as a result of logic division processing carried out by the logic dividing unit 119. The division result file 120 is an input to processing carried out at the step S2504 of the flowchart shown in FIG. 25 to place and wire FPGAs assigned to results of logic division. As a result, data for programming the FPGAs can be obtained.

Reference numeral 121 denotes a delay limit file for describing delay limits for the logic circuit 101. Reference numeral 122 denotes a delay check unit for carrying out processing to check delays with the division result file 120 and the delay limit file 121 each used as an input and storing interface signals among the division results in an order of increasing discrepancies between delays of paths including the interface signals among the division results and limit values. Reference numeral 123 denotes an inter-division-result interface priority order file for storing results of processing carried out by the delay check unit 122.

Reference numeral 124 denotes a module wiring unit for carrying out processing to associate wires on the module with logic interface signals by using the division result file 120, the connector-pin assignment specification file 106 or the connector-pin assignment result file 117, the inter-division-result interface priority order file 123 and the wire connection information file 103 as inputs. Reference numeral 125 denotes a wiring result file for storing associations of wires on the module with logic interface signals which are obtained as a result of the processing carried out by the module wiring unit 124. The wiring result file 125 is used as data for programming switch devices mounted on the module. The wiring result file 125 also serves as an input to the processing carried out at the step S2504 of the flowchart shown in FIG. 25 to associate pins of FPGAs mounted on the module with logic interface signals.

Figure 2:
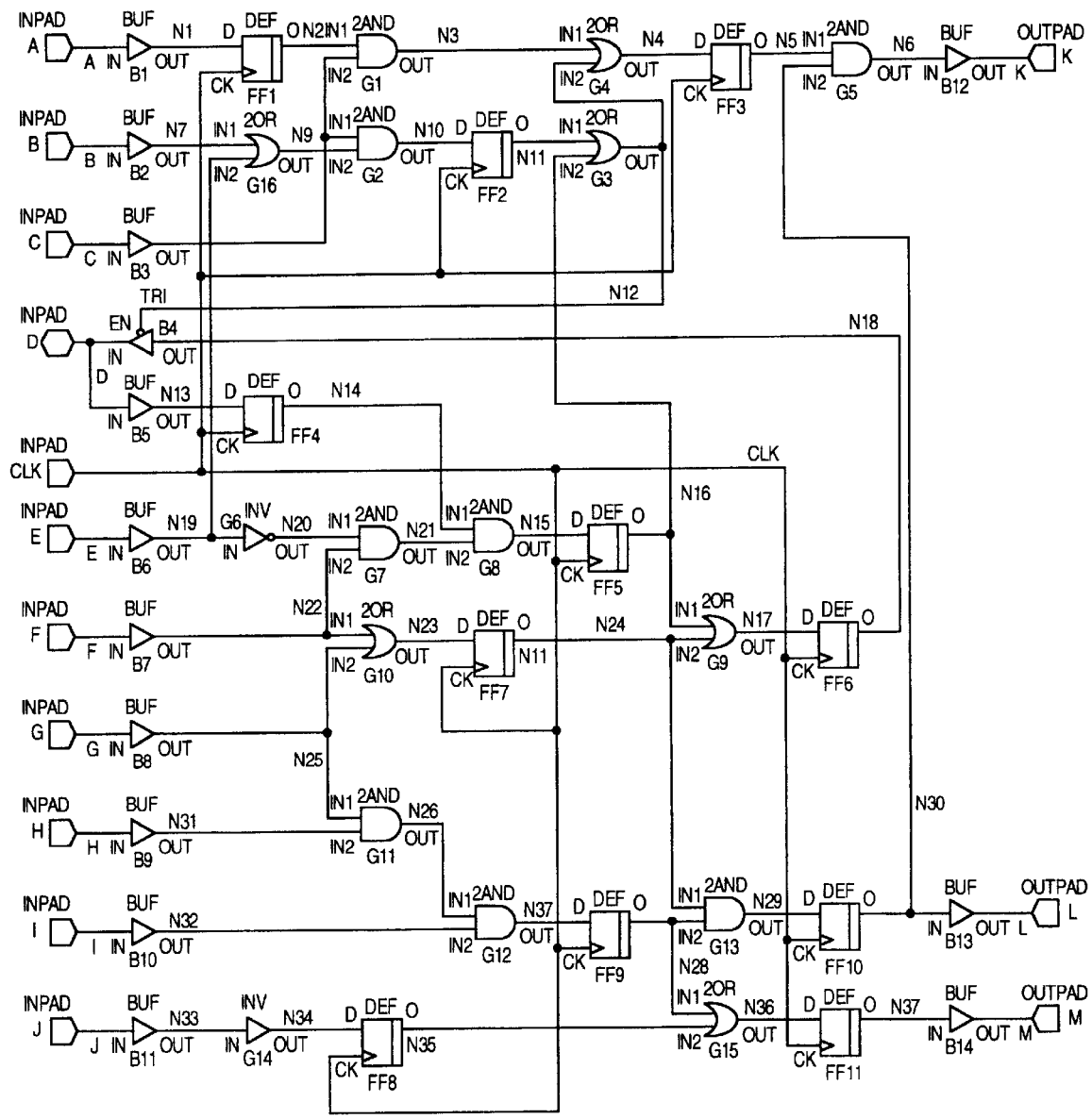
FIG. 2 is a diagram showing a typical logic circuit input to the logic dividing and module wiring system provided by the present invention.

FIG. 2 is a diagram showing an example of the typical logic circuit 101. Symbols A, B, C, D, E, F, G, H, I, J, K, L, M and CLK each denote an external interface signal of the logic circuit 101. Symbols INPAD, OUTPAD and INOUTPAD each denote an attribute representing a signal direction assigned to each external interface signal. Symbols BUF, TRI, DFF, 2AND, 2OR and INV each denote the type of a gate employed in the logic circuit 101. Symbols FF1 to FF11, B1 to B14 and G1 to G16 are each an instance name given uniquely to each gate employed in the logic circuit 101. Symbols N1 to N37 are each a net name given uniquely to a net logically connecting gates employed in the logic circuit 101. Symbols IN, OUT, IN1, IN2, D and CK are each a pin name given to a pin of each gate. The logic circuit 101 is described in a format normally such as an EDIF (Electronic Design Interchange Format).

Figure 3:
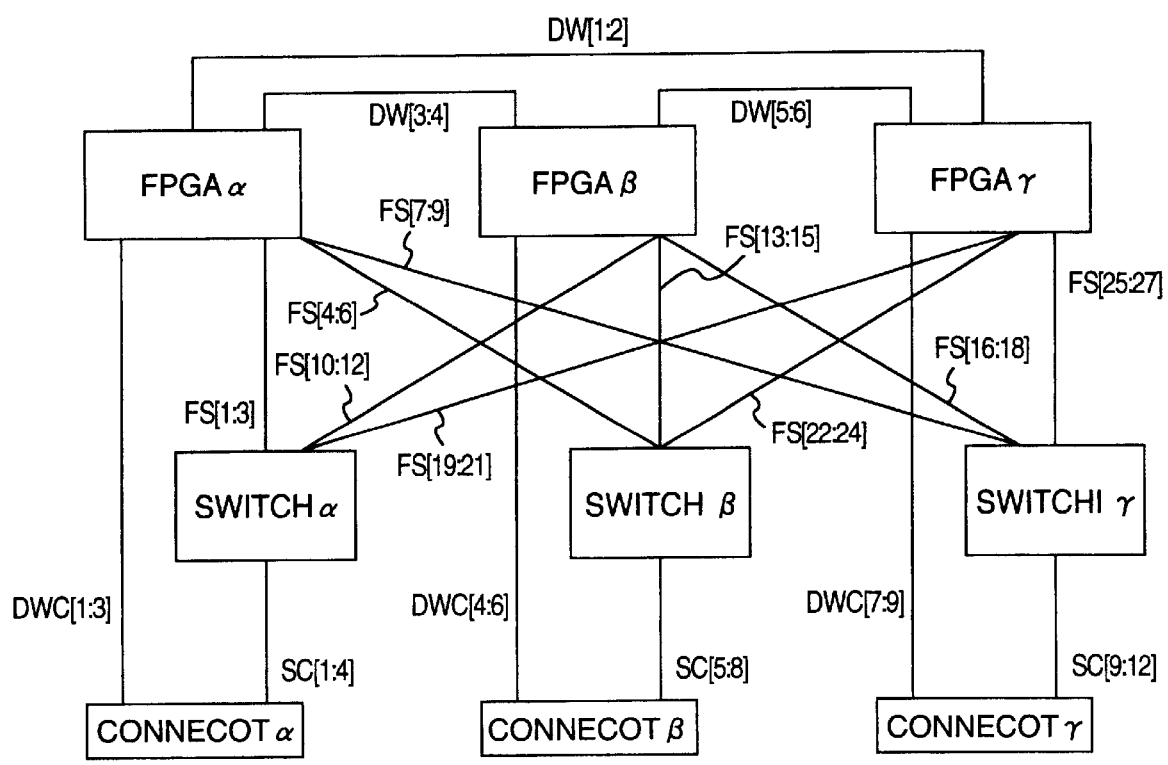
FIG. 3 is a diagram showing a typical module serving as a target of the logic dividing and module wiring system provided by the present invention.

FIG. 3 is a diagram showing typical connections of FPGAs, switches and connectors. In this example, three FPGAs, three switches and three connectors are employed.

In FIG. 3, symbols FPGAα, FPGAβ and FPGAγ each denote an FPGA whereas symbols SWITCHα, SWITCHβ and SWITCHγ each denote a switch device. Symbols CONNECTORα, CONNECTORβ and CONNECTORγ each denote a connector. A symbol DW [1:2] indicates that wires DW1 and DW2 are drawn between FPGAα and FPGAγ. By the same token, a symbol DW [3:4] indicates that wires DW3 and DW4 are drawn between FPGAα and FPGAβ whereas a symbol DW [5:6] indicates that wires DW5 and DW6 are drawn between FPGAβ and FPGAγ. Symbols FS [1:3], FS [4:6], FS [7:9], FS [10:12], FS [13:15], FS [16:18], FS [19:21], FS [22:24] and FS [25:27] each denote three wires connecting an FPGA to a switch device. Symbols DWC [1:3], DWC [4:6] and DWC [7:9] denote three 3-wire groups connecting CONNECTORα to FPGAα, CONNECTORβ to FPGAβ and CONNECTORγ to FPGAγ respectively. Symbols SC [1:4], SC [5:8] and SC [9:12] denote three groups of four wires connecting CONNECTORα to SWITCHα, CONNECTORβ to SWITCHβ and CONNECTORγ to SWITCHγ respectively.

FIG. 4 is a diagram showing an example of the wire connection information file 103. The wire connection information file 103 shown in FIG. 4 described the wire connections shown in FIG. 3. A string of characters following a character string of MODULE on the first line is the type of the module. In this example, the type of the module shown in FIG. 3 is TYPEA. The wire connection information file 103 begins with the character string of MODULE on the first line and ends with a character string of END MODULE on the 26$^{th}$ line. The second to tenth lines are each a line beginning with a character string of DEVICE. Each of these lines defines the part name of a part mounted on he module and defines an instant name uniquely given to the part. FPGA, SWITCH and CONNECTOR are part names of an FPGA, a switch device and a connector respectively.

FPGAα, FPGAβ, FPGAγ, SWITCHα, SWITCHβ, SWITCHγ, CONNECTORα, CONNECTORβ and CONNECTORγ are each an instance name given to a part. A line beginning with a character string of DEVICE_PIN and the following line define pin names of a part. In this example, the 11$^{th}$, 13$^{th}$ and 15$^{th}$ lines are each a line beginning with a character string of DEVICE_PIN are whereas the 12$^{th}$, 14$^{th}$ and 16$^{th}$ lines follow the 11$^{th}$, 13$^{th}$ and 15$^{th}$ lines respectively. A string of characters following the character string of DEVICE_PIN is a part name. The following line describes a list of pin names of the part identified by the part name with the pin names delimited from each other by a comma. For example, the part name on the 11$^{th}$ line is FPGA and pin names of the FPGA on the 12$^{th}$ line are A0, A1, A2, . . . and A15. A line beginning with a string character of WIRE defines a wire name of a wire and destination of connections of the wire. The 17$^{th}$ to 25$^{th}$ lines in this example are each a line beginning with a string character of WIRE. A string of characters following the character string of WIRE is the name of a wire which is followed by a destination of connection. A destination of connection is the part instance name of a part and a pin name of the part which are delimited from each other by a slash '/'. For example, the 17$^{th}$ line describes a wire DW1 connecting pin A0 of FPGAα to pin A4 of FPGAγ.

Figures 5, 6:
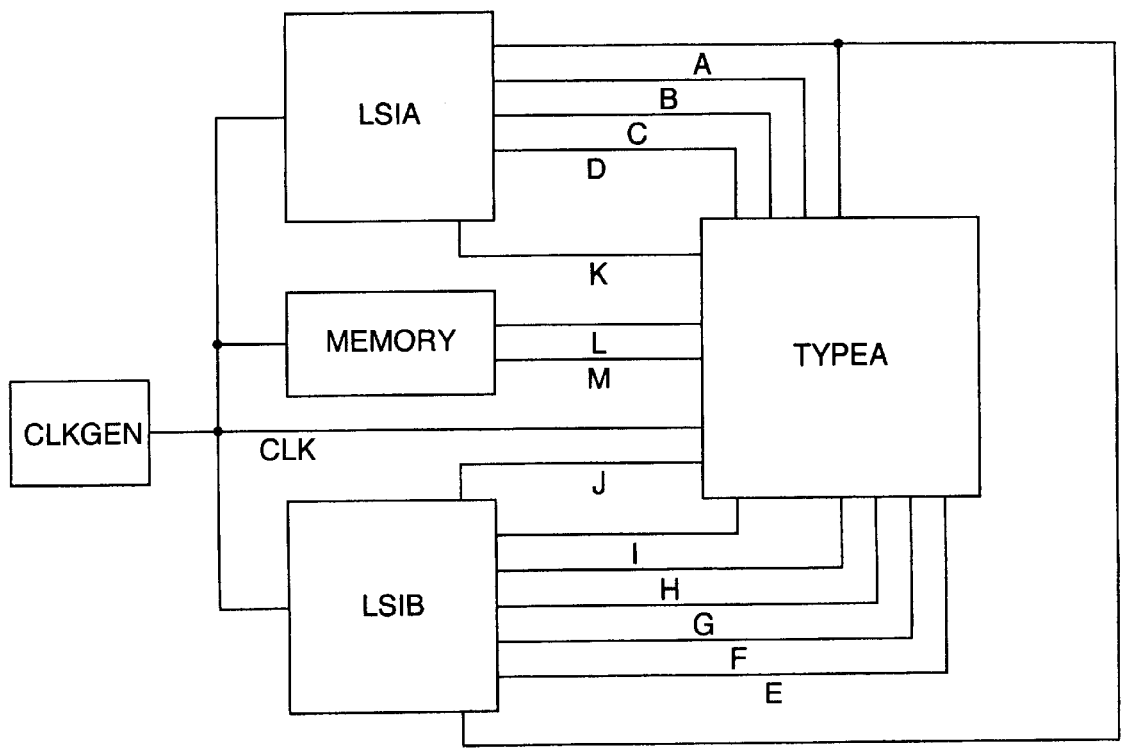
FIG. 5 is a diagram showing a typical connector-pin assignment specification file 106.
FIG. 6 is a block diagram showing a typical board on which the module shown in FIG. 3 is mounted.

FIG. 5 is a diagram showing a typical connector-pin assignment specification file 106. The first field of each line describes the name of an external interface signal of the logic circuit 101 whereas the second field describes the part instance name of an assigned connector and the pin name of a pin on the connector. The part instance name and the pin name of the connector are delimited from each other by a slash '/'. For example, the first line assigns an external interface signal 'K' of the logical circuit 101 to pin "C0" of CONNECTORα.

FIG. 6 is a block diagram showing a typical board on which the module TYPEA shown in FIG. 3 is mounted. To be more specific, the figure shows connections between the module TYPEA and other parts on the board. In FIG. 6, symbols LSIA, LSIB, CLKGEN and MEMORY are each a part available in the market. Symbols A, B, C, D, E, F, G, H, I, J, K, L, M and CLK shown in the figure each denote an external interface signal of the logic circuit 101 which is programmed in the module TYPEA shown in FIG. 3. The module TYPEA is connected to the parts LSIA, LSIB, CLKGEN and MEMORY which are available in the market by the external interface signals A, B, C, D, E, F, G, H, I, J, K, L, M and CLK.

FIG. 7 is a diagram showing a typical board net list 108 describes connections of the board shown in FIG. 6 as a text. The board net list 108 begins with a character string of BOARD on the first line and ends with a character string of END BOARD on the 13$^{th}$ line. On the first line, the character string of BOARD is followed by a character string of SYSTEMA which can be any string of characters representing the entire logic. Each of the second to sixth lines starting with a character string of DEVICE defines the type of a part mounted on the board and a part instance name uniquely given to the part. For example, LSIA on the second line is the type of a part mounted on the board and LSI_A is a part instance name given to this part. The 7$^{th}$ to 12$^{th}$ lines each starting with a character string of NET each define the net name of a net connecting parts mounted on the board and a list of connection destinations thereof. Delimited from each other by a comma on the list, the connection destinations are part instance names defined by the lines each beginning with the character string of DEVICE. It should be noted that a part instance name described as the connection destination at the beginning of the list is the part instance name of a part driving a signal in the net. on the 7$^{th}$ line, for example, the list indicates that the net A transfers a signal output by a part having a part instance name of LSI_A to parts with part instance names of Logic and LSI_B. The part instance name of Logic is assigned to the part type of TYPEA which is given to the module shown in FIG. 3. That is to say, the part instance name of Logic is assigned to the module.

FIG. 8 is a diagram showing a typical connector connection information file 105. The first line shown in FIG. 8 begins with a character string of CONNECTOR which is followed by a string of characters describing a part instance name of CONNECTORα uniquely given to a connector on the module. The second and subsequent lines up to a line beginning with a character string of CONNECTOR each describe a connector pin name, the name of a wire on the module and a part instance name for a connector with a part instance name of CONNECTORα described on the first line.

For example, the second line indicates that pin C0 of the connector with a part instance name of CONNECTORα is connected to a part named FPGAα by a wire named DWC1 on the module.

FIG. 9 is a diagram showing a typical external interface group list 110. The external interface group list 110 is created from the board net list 108 in case external interface signals are not assigned to connector pins. Symbols PG1, PG2, PG3 and PG4 described in the first fields of the lines shown in the figure are each an external interface signal group label uniquely assigned to a group of external interface lines. PG1 on the first line is the label of a group of external interface lines of the part TYPEA connected to the part LSIA as shown in FIG. 6. A signal A of the group is also connected to the part LSIB. If an external interface signal is connected to a plurality of connection destinations as is the case with the signal A, a part driving the external interface signal is treated as the connection destination of the highest priority. As is obvious from the 7$^{th}$ line of the board net list 108 shown in FIG. 7 which shows a text expressing the block diagram shown in FIG. 6, the part driving the signal A is LSIA. Thus, the signal A can be included in the group PG1 which is connected to the part LSIA. By the same token, PG2 on the second line shown in FIG. 9 is the label of a group of external interface signals of the part TYPEA connected to the part MEMORY shown in FIG. 6. Likewise, PG3 on the third line is the label of a group of external interface signals of the part TYPEA connected to the part LSIB shown in FIG. 6. Similarly, PG4 on the fourth line is the label of a group of external interface signals of the part TYPEA connected to the part CLKGEN shown in FIG. 6.

FIG. 10 is a diagram showing a typical gate library 111. The gate library 111 defines a gate name, a gate type, a signal transfer path in a gate between input and output pins and a delay time for each gate. Description of information on each gate starts with a line beginning with a character string of CELL. A string of characters following the character string of CELL is a gate name. The gate name is followed by a character string of TYPE which is followed by a gate type.

A line beginning with a character string of ARC defines a signal transfer path in the gate between input and output pins and a delay time. For example, the first and second lines indicate that the gate type of a gate BUF is a buffer and a signal is transferred from a pin IN to a pin OUT at a signal transfer delay of 2 ns. By the same token, the eighth, ninth and tenth lines indicate that the gate type of a gate 2AND is an AND gate, a signal is transferred from a pin IN1 to a pin OUT at a signal transfer delay of 2 ns and a signal is transferred from a pin IN2 to a pin OUT at a signal transfer delay of 3 ns.

FIG. 11 is a diagram showing a typical trace result file 113. As shown in the figure, the trace result file 113 describes a result of tracing a path of an external interface signal of the logic circuit 101 to a memory device for each external interface signal. The first field of the trace result file 113 shown in FIG. 11 describes an external interface signal. The second and subsequent fields describe a result of tracing a path. To be more specific, the result of tracing a path is instance names of gates on the path passed through by the external interface signal before arriving at a memory device. For example, the first line indicates that an external interface signal L passes through gates B13 and FF10 which are described as a result of tracing a path of the logic followed by the signal L.

FIG. 12 is a diagram showing a typical external interface priority specification file 114. As shown in the figure, each line of the external interface priority specification file 114 describes an external interface signal of the logic circuit 101 and the level of criticality of the delay expressed by a number. To be more specific, the first field of the external interface priority specification file 114 shown in FIG. 12 describes the name of an external interface signal and the second field describes the level of criticality of the delay expressed by a number. The number representing the level of criticality of the delay is typically a delay value caused by an element external to the module. The external delay value is typically used as it is. A character string of EX on the 14$^{th}$ line indicates that it is not necessary to take the criticality of the delay into consideration for the external interface signal CLK.

FIG. 13 is a diagram showing a typical connector-signal association list 115. As shown in the figure, the unit of information described in the connector-signal association list 115 is two lines. The first line of the unit is the name of a connector. The second line of the unit is a group of external interface signals of the logic circuit 101 to be assigned to the connector. For example, the first and second lines of the connector-signal association list 115 indicate that a group of external interface signals A, B, C, D and K are to be assigned to a connector named CONNECTORα.

FIG. 14 is a diagram showing a typical connector-pin assignment result file 117. The connector-pin assignment result file 117 describes assignments of external interface signals of logic to connector pins in a format conforming to the connector-pin assignment specification file 106 shown in FIG. 5. The connector-pin assignment result file 117 is created from the board net list 108 or the connector-signal association list 115 in case the connector-pin assignment specification file 106 is not available.

FIG. 15 is a diagram showing a typical division initial state file 118. Each line of the division initial state file 118 describes the part instance name of an FPGA on the module and a list of instance names of gates related to external interface signals of the logic circuit 101 to be assigned to the FPGA. For example, the first line describes a command requesting that a list of gates B12, G5, FF3, B1, FF1, B2, G16, G2 and FF2 of the logic circuit 101 be assigned to the FPGA with a part instance name of FPGAα.

Figures 16, 17:
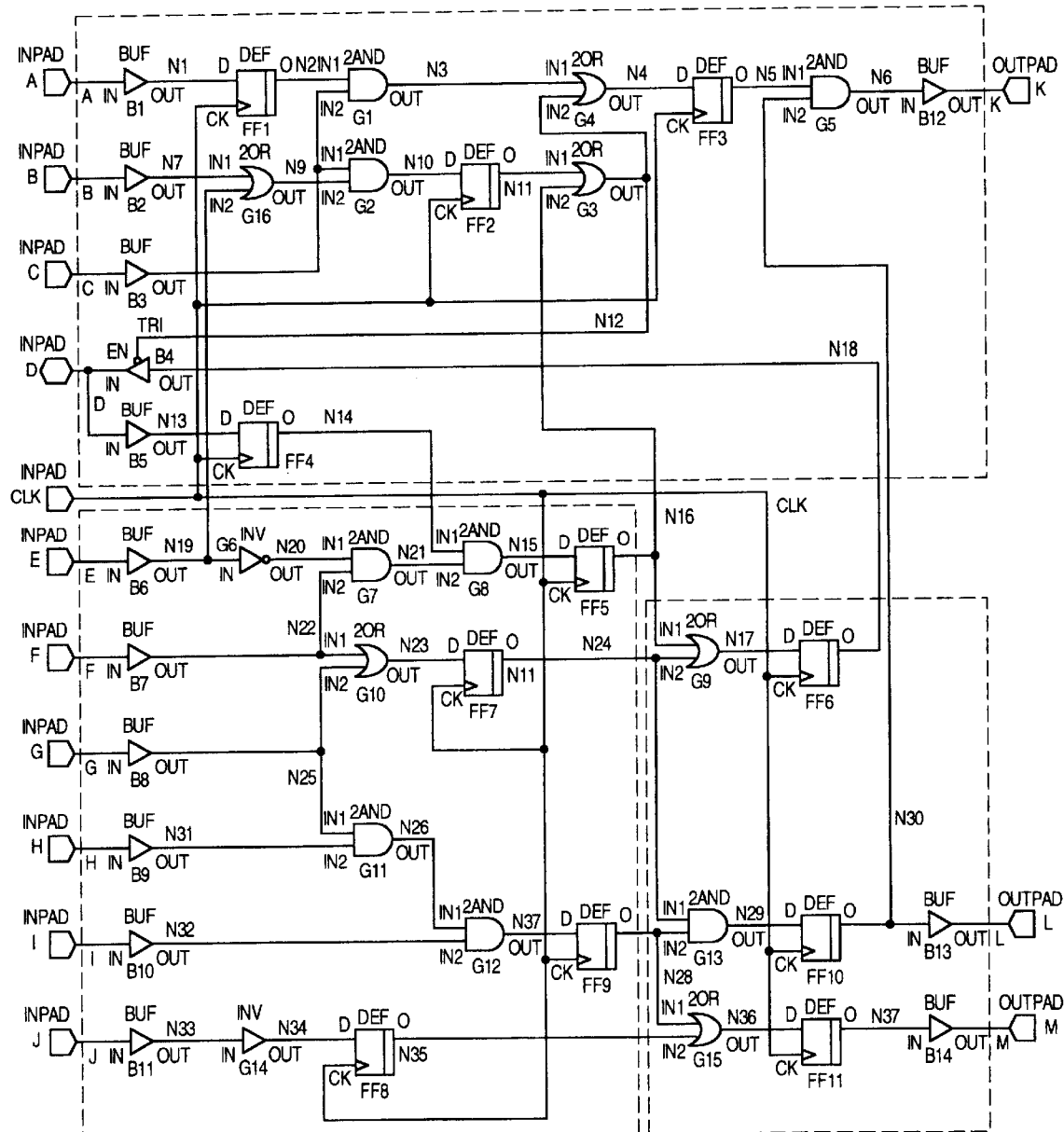
FIG. 16 is a diagram showing typical circuits obtained as a result of logic division.
FIG. 17 is a diagram showing a typical delay limit file 121.

FIG. 16 is a diagram showing typical circuits which are obtained as a result of division of the logic circuit 101 shown in FIG. 2 and targeted at the module shown in FIG. 3. These circuits obtained as a result of logic division are described in a division result file 120 in an FDIF (Electronic Design Interchange Format). It should be noted that FIG. 16 shows FPGAα, FPGAβ and FPGAγ, three circuits obtained as a result of division of the logic circuit 101 shown in FIG. 2 in accordance with the division initial state file 118 shown in FIG. 15.

FIG. 17 is a diagram showing a typical delay limit file 121. Character strings of TO and CLK following a character string of Clock on the first line of the delay limit file 121 shown in the figure are a clock name and a net name respectively. A clock name is a unique name given to each clock type. The second to fourth lines describe delay limits for the clock T0. To be more specific, the second line indicates that the delay limit of a path between a memory device driven by the clock T0 and a memory device at the next stage also driven by the clock T0 is 20 ns. The third line indicates that the delay limit of a path between a memory device driven by the clock T0 and an output signal of an external interface of logic is 11 ns. The fourth line indicates that the delay limit of a path between an input signal of an external interface of logic and a memory device driven by the clock T0 is 9 ns.

FIG. 18 is a diagram showing a typical inter-division-result interface priority order file 123. Each line of the inter-division-result interface priority order file 123 shown in FIG. 18 describes the name of an interface signal between division results, and a difference between a delay limit value and a delay value of a path passed through by the signal. For example, the name of an interface signal between division results on the first line is N19. According to the division result file 120 shown in FIG. 16, the path of the interface signal N19 starts from an external interface signal E of logic and ends at a memory device FF2 driven by the clock T0. In accordance with the gate library 111, the delay value of the path is 2 ns (of BUF)+4 ns (of 2OR)+3 ns (of 2AND)=9 ns. As described earlier by referring to FIG. 17, the delay limit value of a path between an input signal of an external interface of logic and a memory device driven by the clock T0 is also 9 ns. Thus, the difference between the delay limit value and the delay value of the path passed through by the signal is 0 ns. It is said that, the smaller the difference between the delay limit value and the delay value of a path, the higher the criticality level of the delay along the path.

FIG. 19 is a diagram showing a typical wiring result file 125. Each line of the wiring result file 125 shown in FIG. 19 describes a pair comprising a first field and a second field associated with the first field. The first field is an external interface signal of the logic circuit 101 or an interface signal between FPGAs obtained as a result of logic division shown in FIG. 16. The second field is the name of a wire on the module shown in FIG. 3. For example, the first line associates an external interface signal K of the logic circuit 101 with a wire DWC1 on the module. The 18$^{th}$ line associates an interface signal N16 between division results of the division result file 120 with wires FS5, FS14 and FS23 on the module.

Figure 20:
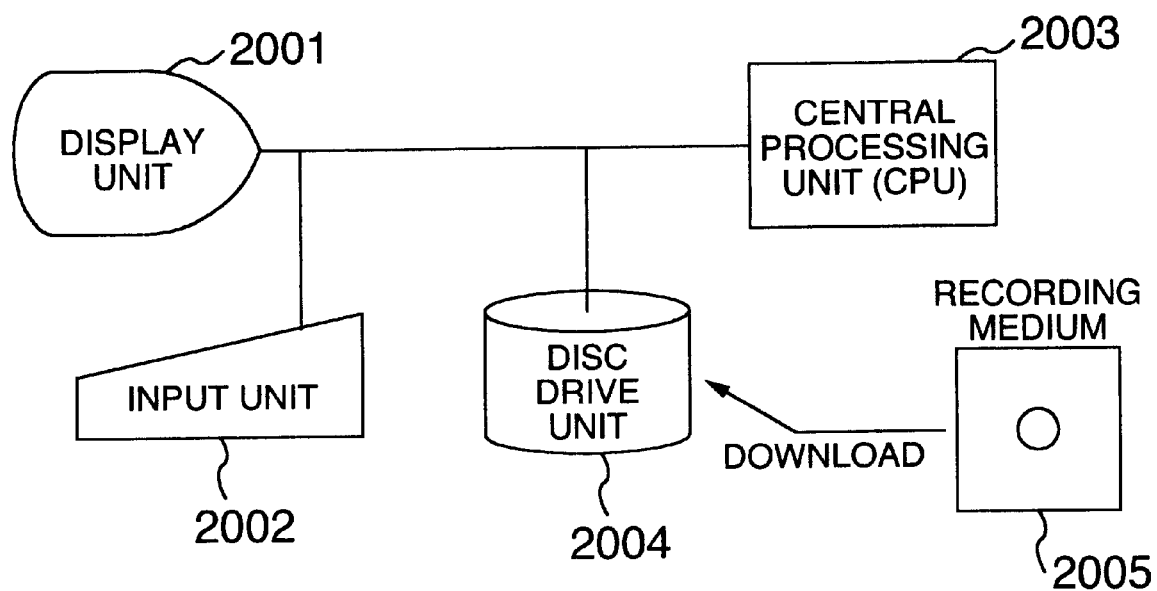
FIG. 20 is a diagram showing a typical configuration of hardware implementing the logic dividing and module wiring system provided by the present invention.

FIG. 20 is a diagram showing a typical configuration of hardware implementing the logic dividing and module wiring system. In the figure, reference numeral 2001 denotes a display unit for displaying results of processing. Reference numeral 2002 denotes an input unit such as a keyboard used by the user for entering data such as the logic circuit 101 or the connector-pin assignment specification file 106. Reference numeral 2003 denotes a CPU for driving the logic-dividing and module-wiring system. To be more specific, the CPU 2003 carries out various kinds of extraction processing, division processing and assignment processing to mention a few. Reference numeral 2004 denotes a disc unit such as a hard disc for storing the logic-dividing and module-wiring system and design data. Reference numeral 2005 denotes a recording medium such as a CD-ROM for storing the logic-dividing and module-wiring system. By downloading the data stored in the recording medium 2005 into the disc unit 2004, the logic-dividing and module-wiring system can be operated.

Figure 21:
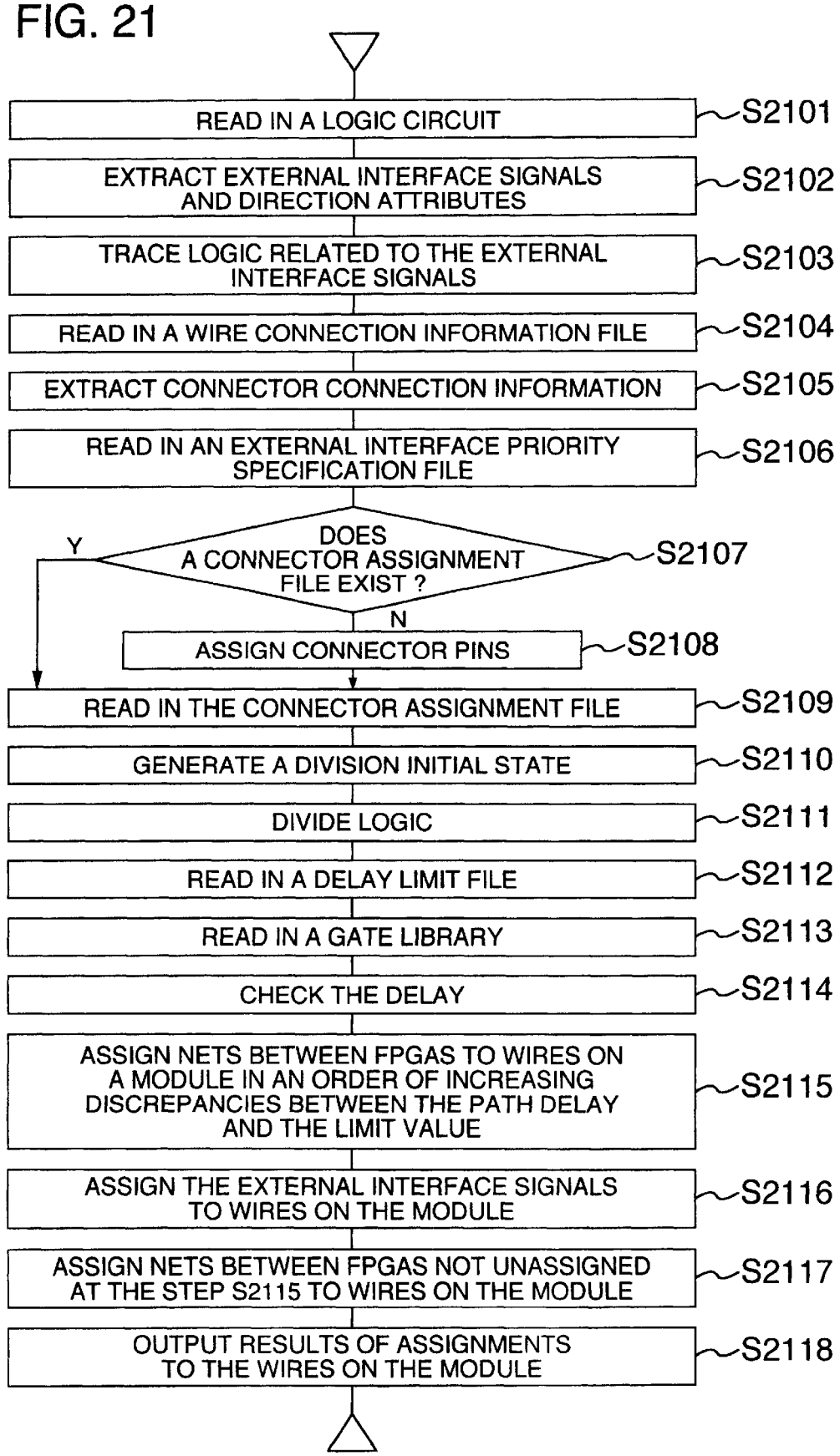
FIG. 21 shows a flowchart representing processing carried out by the logic dividing and module wiring system provided by the present invention.
Figure 22:
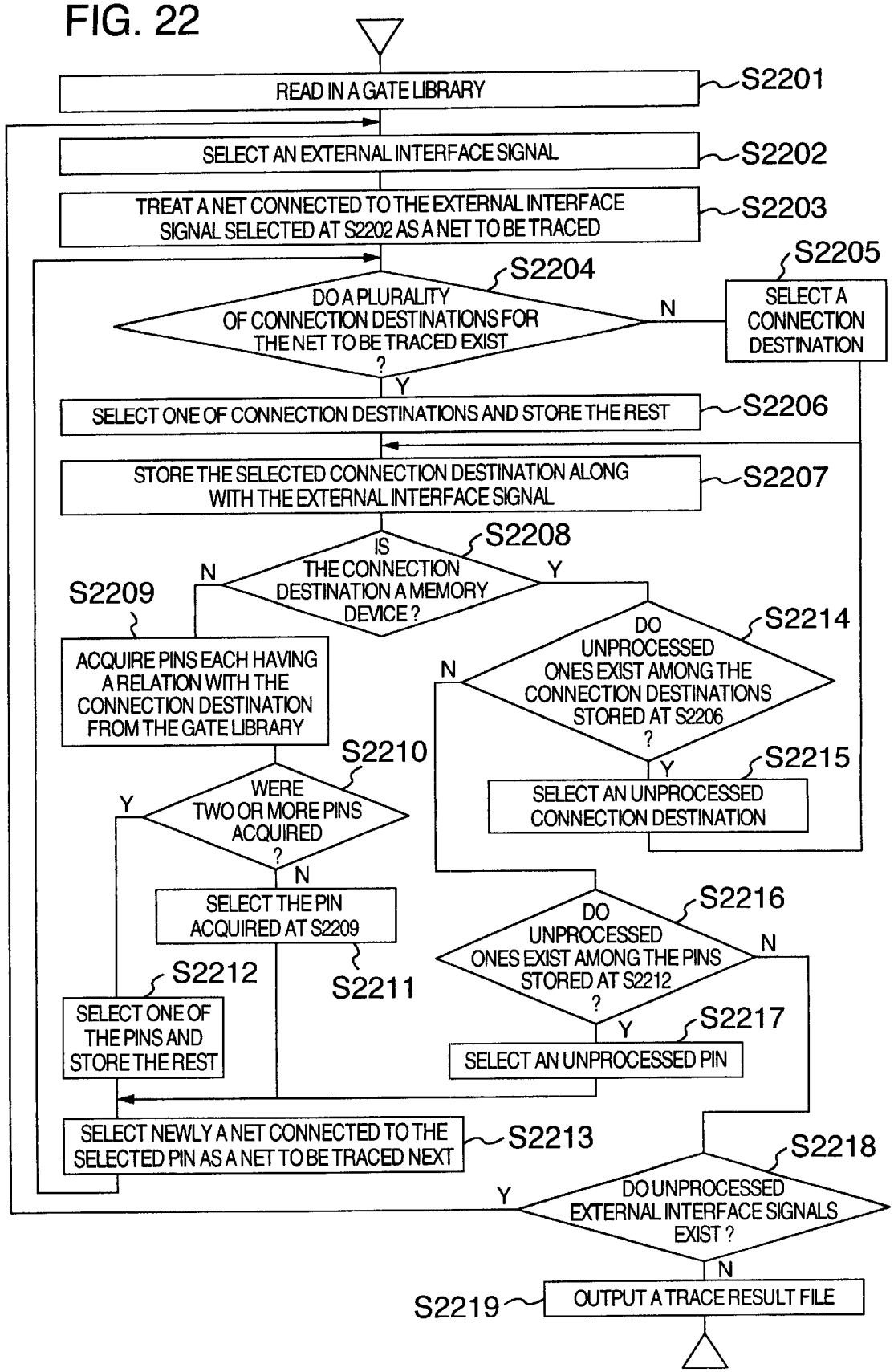
FIG. 22 shows a flowchart representing processing carried out by a logic trace unit 112.
Figure 23:
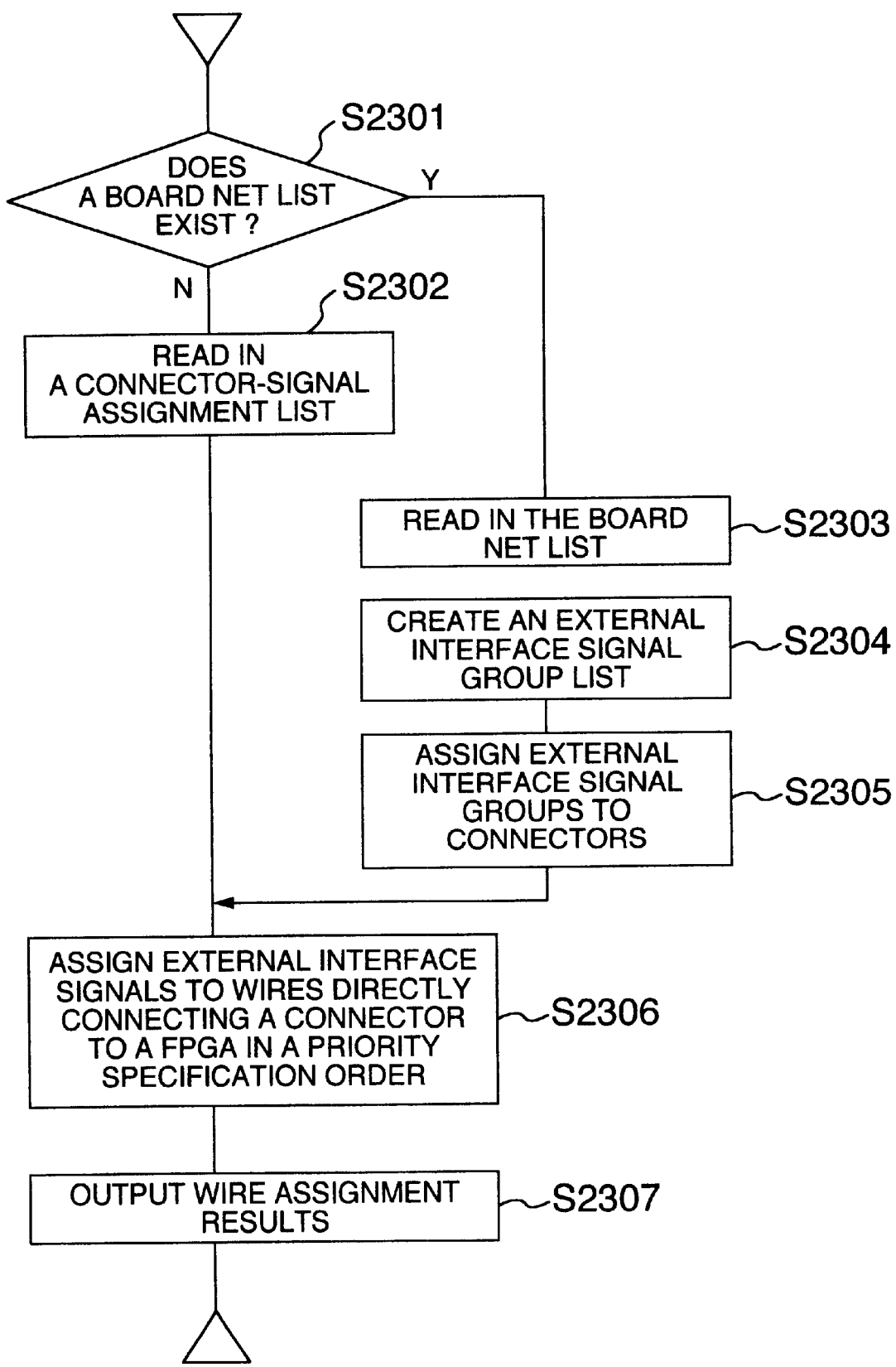
FIG. 23 shows a flowchart representing processing which is carried out when the connector-pin assignment specification file 106 is not input.
Figure 24:
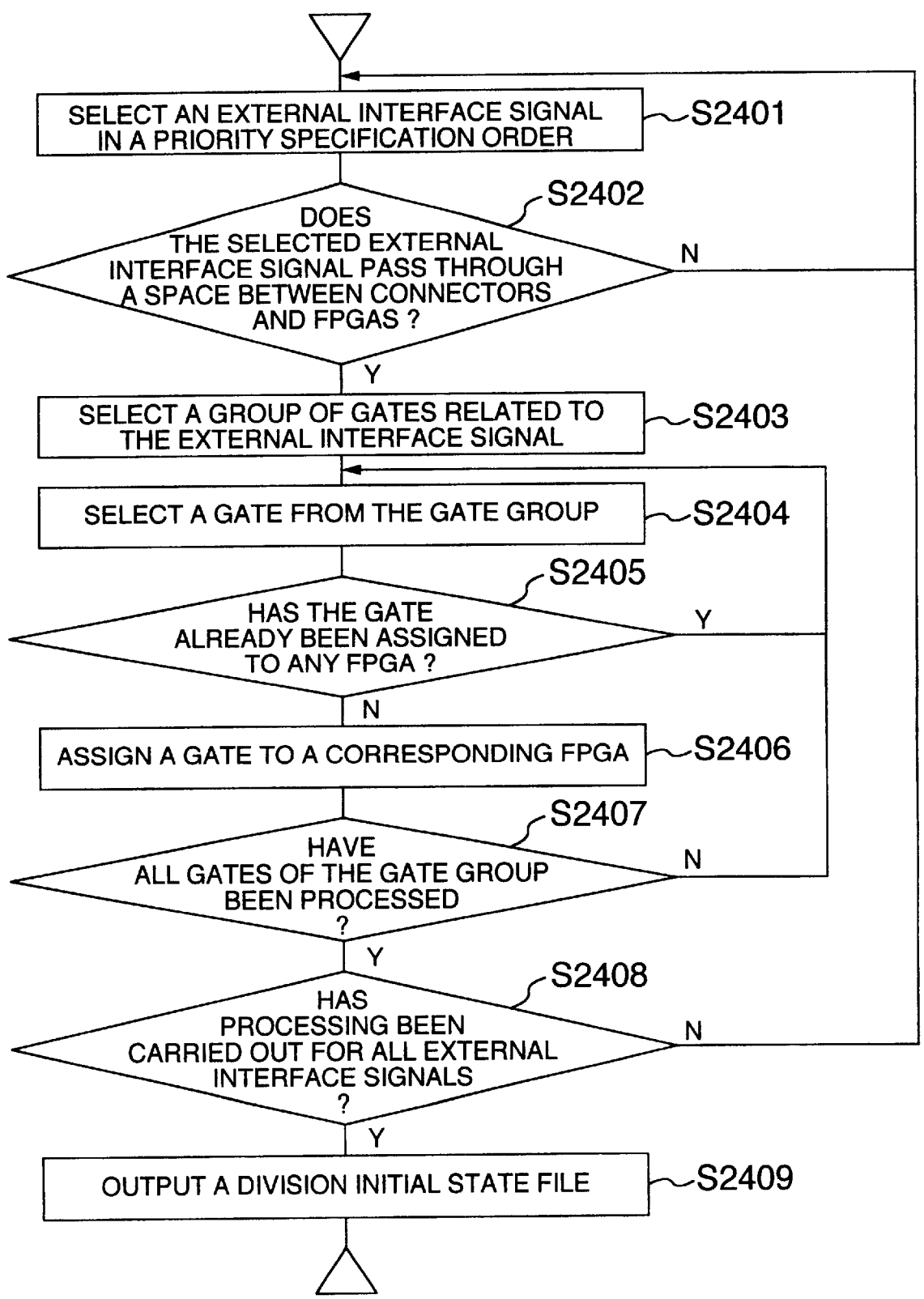
FIG. 24 shows a flowchart representing processing carried out by a division initial state generation unit 116.

FIG. 21 shows a flowchart representing processing carried out by the logic dividing and module wiring system. FIG. 22 shows a flowchart representing processing carried out by a logic trace unit 112 shown in FIG. 1. FIG. 23 shows a flowchart representing processing which is carried out when assignment of external interface signals to connector pins are not determined. FIG. 24 shows a flowchart representing processing carried out by a division initial state generation unit 116 shown in FIG. 1.

The logic-dividing and module-wiring system is explained by referring to the flowcharts shown in FIGS. 21, 22, 23 and 24 as follows.

The flowchart shown in FIG. 21 begins with a step S2101 at which the logic circuit 101 is read in by the logic input unit 102 shown in FIG. 1. In actuality, the user operates typically the input unit 2002 to enter the logic circuit 101 to be stored into a main memory not shown in the figure. As an alternative, the logic circuit 101 is transferred from the recording medium 2005 as a file to the disc unit 2004.

A variety of operations to enter information via the input unit 2002 described below can be replaced by an operation to transfer the information from the recording medium 2005 as a file to the disc unit 2004. Processing to read information at a variety of input units to be described later is carried out in the same way.

In the processing described below, the logic circuit 101 shown in FIG. 2 is assumed to have been input.

At the next step S2102, external interface signals of the logic circuit 101 and their direction attributes are extracted for logic tracing. The processing carried out at this step is part of processing performed by the logic input unit 102 shown in FIG. 1. For example, the CPU 2003 carries out the processing by using a logic circuit file stored in the main memory. Processing to extract specific information from an input read in by a variety of processing units to be described later can be carried out in the same way. External interface signals of the logic circuit 101 shown in FIG. 2 are A, B, C, D, E, F, G, H, I, J, K, L, M and CLK. As for the direction attributes, A, B, C, E, F, G, H, I and J are each an input signal whereas K, L and M are each an output signal. D is an input/output signal.

At the next step S2103, logic from an external interface signal stored at the step S2102 to a point of arrival at the memory device is traced by the logic trace unit 112 shown in FIG. 1. This processing will be described more later by referring to a flowchart shown in FIG. 22. In the following explanation, results of the processing carried out at the step S2103 are assumed to have been stored in the trace result file 113 shown in FIG. 11.

At the next step S2104, the wire connection information file 103 shown in FIG. 4 is read in by the wire information input unit 104 shown in FIG. 1.

At the next step S2105, the wire information input unit 104 shown in FIG. 1 extracts the names of wires connected to connectors and their connection destinations from the wire connection information file 103 read in at the step S2104. To be more specific, connectors with part instance names of CONNECTORα, CONNECTORβ and CONNECTORγ are acquired respectively from the eighth, ninth and tenth lines of the wire connection information file 103 shown in FIG. 4. Then, the names of wires connected to CONNECTORα, CONNECTORβ and CONNECTORγ, the names of pins of CONNECTORα, CONNECTORβ and CONNECTORγ and their connection destinations are acquired from the $17^{th}$ and subsequent lines which each begin with a character string of WIRE. In the case of the wire connection information file 103 shown in FIG. 4, for example, a connector with a part instance name of CONNECTOR5, a connector pin C0 of the connector, a wire DWC1 connected to the pin C0 and a connection destination FPGAα are acquired from the $19^{th}$ line. Results of this processing are stored in the connector connection information file 105 shown in FIG. 8. The connector connection information file 105 describes the name of a wire, the name of a connector in and a connection destination acquired by adopting the technique described above for each connector.

At the next step S2106, the external interface priority specification file 114 shown in FIG. 12 is read in.

Then, the flow of the processing goes on to a step S2107 to form a judgment as to whether or not the connector-pin assignment specification file 106 exists. If the connector-pin assignment specification file 106 exists, the flow of the processing continues to a step S2109. Otherwise, the flow proceeds to a step S2108.

At the step S2108, the board net list 108 or the connector-signal association list 115 is input, and processing is carried out to determine assignments of connector pins of the module to external interface signals of logic. In addition, the connector-pin assignment result file 117 is output as results of this processing. An example of the connector-pin assignment result file 117 is shown in FIG. 14. This processing will be described more later by referring to a flowchart shown in FIG. 23.

At the step S2109, processing is carried out by the input unit 107 shown in FIG. 1 to input the connector-pin assignment specification file 106 shown in FIG. 5.

Then, at a step S2110, processing is carried out to assign logic, which is relevant to external interface signals assigned to wires directly connected to connector pins and FPGAs, to FPGAs directly connected to assigned connector pins on the basis of the connector-pin assignment specification file 106 read in at the step S2109 or the connector-pin assignment result file 117 output at the step S2108 and the trace result file 113 output at the step S2103. This processing will be described more later by referring to a flowchart shown in FIG. 24. In the following explanation, results of this processing are assumed to have been stored in the division initial state file 118 shown in FIG. 15.

Next, at a step S2111, the CPU 2003 divides the logic circuit 101 on the basis of the division initial state file 118 of FIG. 15 which has been obtained as a result of the processing carried out at the step S2110 and generates the division result file 120 as a result of the logic division. After the division of the logic circuit 101 based on the division initial state file 118 has been completed, an error may be pointed out in case the results of the logic division exceed limitations such as the pin count of an FPGA to which a piece of logic resulting from the division is to be assigned and an allowable logic size. Instead of pointing out an error, the logic division processing can be repeated by deleting a group of gates described in the division initial state file 118 on the basis of priority described in the external interface priority specification file 114. It should be noted that, as a logic division technique, a technology is disclosed in Japanese Patent Laid-open No. Hei 8-212249. Results of this processing are used as an input to processing carried out at a step S2504 of a flowchart shown in FIG. 25. The results of the logic division processing are the circuits shown in FIG. 16.

At the next step S2112, processing is carried out to read in the delay limit file 121 shown in FIG. 17.

Then, at a step S2113, processing is carried out to read in the gate library 111. The processing of the step S2113 can be omitted if the gate library 111 has been read in at a step S2201 of the flowchart shown in FIG. 22 to be described later. In the following explanation, the gate library 111 read in at the step S2113 is assumed to be the gate library 111 shown in FIG. 10.

Then, at a step S2114, delays are checked on the basis of the delay limit file 121 of FIG. 17 read in at the step S2112 and circuits of FIG. 16 obtained as a result of the logic division carried out at the step S2111. Objects of the delay checking are paths subjected to checking against limits described in the delay limit file 121 read in at the step S2112 and determined to pass through areas between FPGAs for the circuits obtained as a result of the logic division processing carried out at the step S2111. In the case of the circuits of FIG. 16 obtained as a result of the logic division processing, for example, nets determined to pass through areas between FPGAs for the circuits obtained as a result of the logic division processing are N14, N16, N18, N19, N24, N28, N30 and N35. Thus, the objects of the delay checking are a path from FF4 to FF5 passing through the net N14, a path from FF5 to FF3 passing through the net N16, a path from FF5 to FF6 also passing through the net N16, a path from FF8 to D passing through the net N18, a path from E to FF2 passing through the net N19, a path from FF7 to FF6 passing through the net N24, a path from FF7 to FF10 also passing through the net N24, a path from FF9 to FF10 passing through the net N28, a path from FF9 to FF11 also passing through the net N28, a path from FF10 to K passing through the net N30 and a path from FF8 to FF11 passing through the net N35. It should be noted that, since a path from E to FF5 passing through the net N19 and a path from FF10 to L passing through V30 do not pass across an FPGA, they are excluded from the delay checking. It is also worth noting that the symbols D, E, K and L each denote an external interface signal of the logic circuit 101 and the symbols FF1 to FF11 each denote a memory device driven by the external interface signal CLK. These paths can be identified by the user by using the input unit 2002 or identified by the CPU 2003 by using the division result file.

In the delay checking, the delay value of each path subjected to the delay checking is compared with a delay limit obtained at the step S2112. The delay value of such a path is computed as a sum of delay values of signal propagation routes inside gates between input and output pins of the gates through which a signal passes. Such delay values are described in the gate library 111. For example, the path from FF4 to FF5 passing through the net N14 comprises gates DFF and 2AND. According to the gate library 111 shown in FIG. 10, the delay of the gate DFF from pin CK to pin O is 5 ns and the delay of the gate 2AND from pin IN1 to pin OUT is 2 ns. Thus, the delay value of this path is 7 ns. On the other hand, the delay limit of a path between memory devices acquired at the step S2112 is 20 ns. Thus, as a result of the delay checking, a difference of 13 ns (=20 ns−7 ns) is obtained. This difference indicates that the path from FF4 to FF5 has an actual path delay margin of 13 ns with respect to the delay limit of 20 ns. The difference between the delay limit and the actual path delay value is referred to hereafter as a delay check value. The delay check values of the other paths can each be computed in the same way. Information on delay values can be stored in advance in the gate circuit 111 as described above or input as a separate file.

Next, one delay check value is selected for nets determined to pass through areas between FPGAs for circuits obtained as a result of the logic division. When there are two or more paths passing through the same gates such as the paths including the gates N16, N24 and N28, the smallest delay check value is selected. Results of this selection processing are stored typically in the inter-division-result interface priority order file 123 shown in FIG. 18. The inter-division-result interface priority order file 123 describes nets determined to pass through areas among FPGAs for circuits obtained as a result of the logic division and delay check values of paths passing through the nets.

A priority is judged by using the delay check values as levels of criticality. The smaller the delay check value of a path, the higher the priority given to the path as a result of the judgment.

At the next step S2115, nets between FPGAs on the module are assigned to wires on the module starting with a net which passes through an area between FPGAs and is determined to have a high priority. Assume, for example, that priorities of nets passing through areas between FPGAs have been determined as shown in FIG. 18. In this case, the assignment begins with a net N19 having the highest priority. Since the net N19 passes through an area between FPGAα and FPGAγ on the module shown in FIG. 3, the net N19 is assigned to a wire DW1 which directly connects FPGAα to FPGAγ. A net having a priority second to that of N19 is N30 which is assigned to DW3. A net having a third priority is N18 which is assigned to DW4. A net having a fourth priority is N16 with FPGAα, FPGAβ, and FPGAγ each serving as a connection destination. Since there are no wires directly connecting the 3 connection destinations on the module shown in FIG. 3, however, the net N16 is excluded from the assignment processing. The assignment processing is finished when the wires directly connecting FPGAs on the module are all used up or all nets passing through areas between FPGAs have been assigned.

Next, at a step S2116, external interface signals are assigned to wires on the basis of the connector-pin assignment specification file 106 input at the step S2109 or the connector-pin assignment result file 117 output at the step S2108. Assume that a pin assigned to a certain external interface signal is connected to a wire connected to a switch device on the module. In this case, the external interface signal is also assigned to a wire from the switch device to an FPGA. For example, let an external interface signal D of the connector-pin assignment specification file 106 shown in FIG. 5 be assigned to a pin C5 of CONNECTORα. According to the circuits of FIG. 16 which are obtained as a result of logic division and illustrate the contents of the division result file 120, the external interface signal D is connected to FPGAα. According to the 24th line of the wire connection information file 103 shown in FIG. 4, the pin C5 of CONNECTORα is connected to SWITCHα. Thus, in this case, a wire SC3 connected to the pin C5 of CONNECTORα as well as a wire FS1 between the switch device SWITCHα and FPGAα are assigned to the external interface signal D.

Then, at a step S2117, wires are assigned to nets between FPGAs, which are not assigned to wires on the module at the step S2115, to wires on the module. In this processing, a wire passing through a switch device may be assigned to a net passing through an area between FPGAs.

Then, at a step S2118, results of assignments of nets to wires on the module at the steps S2115, S2116 and S2117 are generated and output. An example of the results of the processing carried out at the step S2118 is the wiring result file 125 shown in FIG. 19. This results are used as an input to processing carried out at a step S2503 of a flowchart shown in FIG. 25. At the step 2503, pins of FPGAs are associated with logic signals by using the wiring result file 125 and the wire connection information file 103, and results of the association are supplied to processing carried out at a step S2504. If a switch device is mounted on the module, data for controlling the switch device is also created on the basis of the results.

After this series of pieces of processing have been completed, the results of the processing carried out at the step S2111 are supplied to the processing performed at the step S2504 of the flowchart shown in FIG. 25 and logic data obtained at the step S2504 is used to execute logic emulation at a step 2505 of the flowchart shown in FIG. 25.

3 processing groups, namely, a processing group of the steps S2102 and S2103, a processing group of the steps S2104 and S2105 and a processing group of the step S2106, do not have to be carried out in the order shown in the flowchart. That is to say, the order may be changed.

The division result file 120 obtained as a result of the logic division carried out at the step S2111 and the wiring result file 125 obtained as a result of the wiring work carried out at the step S2118 after the logic division are output at the end of the respective steps. As an alternative, the division result file 120 and the wiring result file 125 can also be generated and output as a single division result file.

The following description explains processing to trace logic from an external interface signal to a memory device at which the signal arrives first and to store results of tracing by referring to the flowchart shown in FIG. 22. It should be noted that the general flow of the processing is explained first and then examples are described in concrete terms.

As shown in the figure, the flowchart begins with a step S2201 at which a gate library 111 shown in FIG. 10 is read in. At the next step S2202, a combination of a direction attribute and an external interface signal stored at the step S2022 is selected. One combination is selected at one time.

Then, at a next step S2203, a net connected to the external interface signal selected at the step 2202 is selected as a net on the logic circuit 101 to be traced. It should be noted that, in this case, the direction attribute of the net is set at the same value as the direction attribute of the external interface signal.

Then, the flow of the processing goes on to a step S2204 to form a judgment as to whether or not the net to be traced branches to a plurality of connection destinations. In this case, the direction attribute of the net is examined. In the case of an IN direction attribute, only a gate with two or more connected input pins is determined to be a branch. In the case of an OUT direction attribute, on the other hand, only a gate with two or more connected output pins is determined to be a branch. As for an INOUT direction attribute, only a gate with two or more connected input pins or two or more connected output pins is determined to be a branch.

If the outcome of the judgment formed at the step S2204 indicates that the net to be traced does not branch, the flow of the processing goes on to a step S2205 at which a set of the instance name of the gate and the pin name of the pin of the gate serving as the only connection destination is selected as a trace object. If the outcome of the judgment formed at the step S2204 indicates that the net to be traced branches, on the other hand, the flow of the processing goes on to a step S2206 at which a set of the instance name and the pin name for any one of a plurality of connection destinations is selected as a trace object. A set of the instance name and the pin name for each of the remaining connection destinations is stored as a net branch list.

At the next step S2207, the instance name of a gate selected at the step S2205, S2206 or S2215 is stored along with an external interface signal starting the trace.

Then, the flow of the processing goes on to a step S2208 to form a judgment as to whether or not the gate stored at the step S2207 is a memory device. If the gate is a memory device, the flow of the processing goes on to a step S2214. Otherwise, the flow of the processing goes on to a step S2209. It should be noted that, in this embodiment, a gate determined to be a memory device is identified by a character string of FF following the character string of TYPE in the gate library 111.

Then, the flow proceeds to a step S2209 to select a pin of a gate linked to a pin identified by a pin name of a set of an instance name and a pin name selected as a trace object at the step S2205 or S2206 on the basis of the gate library 111 read in at the step S2201. The linked pin of a gate means a pin associated with a signal transfer path inside the gate which is expressed by a delay value in the gate library 111. On the first 2 lines of the gate library 111 shown in FIG. 10, for example, pins IN and OUT are linked pins of a gate BUF associated with an ARC signal transfer path expressed by a delay value of 2 ns. By the same token, on the $12^{th}$ and $13^{th}$ lines, pins IN1 and OUT of a gate 2OR are linked pins associated with an ARC signal transfer path expressed by a delay value of 3 ns whereas pins IN2 and OUT of the gate 2OR are also regarded as linked pins associated with an ARC signal transfer path expressed by a delay value of 4 ns.

The flow of the processing goes on to a step S2210 to form a judgment as to whether or not the number of pins acquired at the step S2209 is 2 or greater. If only 1 pin was acquired at the step S2209, the flow of the processing goes on to a step S2211 at which the pin acquired at the step S2209 is selected as a pin to be traced. If two or more pins were acquired at the step S2209, on the other hand, the flow of the processing goes on to a step S2212 at which one of the pins acquired at the step S2209 is selected as a pin to be traced. The remaining pins are stored along the instance name of the gate as a pin branch list.

Then, at a step S2213, a net connected to a trace-object pin selected at the step S2211, S2212 or S2217 is selected as a next net to be traced. The flow of the processing then goes back to the step S2204. In this case, if the direction attribute of the pin to be traced is IN, the direction attribute of the net to be traced is set at OUT. If the direction attribute of the pin to be traced is OUT, on the other hand, the direction attribute of the net to be traced is set at IN. If the direction attribute of the pin to be traced is INOUT, the direction attribute of the net to be traced is set also at INOUT.

At a step S2214, the net branch list stored at the step S2206 is examined to form a judgment as to whether or not an unprocessed set of an instance name and a pin name exists. If such a set exists, the flow of the processing goes on to a step S2215 at which a set of an instance name and a pin name is selected from the net branch list. The flow of the processing then goes on to a step S2207. At that time, the selected set of an instance name and a pin name is deleted from the net branch list. If the outcome of the judgment formed at the step S2206 indicates that an unprocessed set no longer exists, on the other hand, the flow of the processing goes on to a step S2216.

The flow of the processing then goes on to a step S2216 to form a judgment as to whether or not an unprocessed set of an instance name and a pin name still exists on the pin branch list stored at the step S2212. If such a set still exists on the list, the flow of the processing proceeds to a step S2217 at which a set of an instance name and a pin name is selected from the pin branch list. The flow of the processing then proceeds to a step S2213. At that time, the selected set of an instance name and a pin name is deleted from the pin branch list. If an unprocessed set no longer exists on the list, on the other hand, the flow of the processing proceeds to a step S2218.

The flow of the processing goes on to the step S2218 to form a judgment as to whether an unprocessed external interface signal still exists. If an unprocessed external interface signal still exists, the flow of the processing continues to a step S2202. Otherwise, the flow of the processing goes on to a step S2219 at which the data stored at the step S2207 is output in a format of the trace result file 113 shown in FIG. 11. Then, the processing is ended.

The following description explains the flow of the processing of FIG. 22 in concrete terms using the logic circuit 101 shown in FIG. 2 and the gate library 111 shown in FIG. 10 in accordance with the processing method described above.

First of all, at the step S2201, the gate library 111 shown in FIG. 10 is read in. Each combination of an external interface signal and a direction attribute is stored at the step S2102 of the flowchart shown in FIG. 21. When the logic circuit 101 shown in FIG. 2 is input, the following combinations are stored:

(A, in), (B, in), (B, in), (D, inout), (E, in), (F, in), (G, in), (H, in), (I, in), (J, in), (K, out), (L, out), (M, out) and (CLK, in)

At the step S2202, the combination of (A, in) is selected initially. In the logic circuit 101 shown in FIG. 2, an external interface signal is given the same name as the net connected to the signal. Thus, at the step S2203, a net treated as the net to be traced is A and the direction attribute is IN.

Since the net A to be traced is connected only to the IN pin of a gate B1, the net A is judged to be a non-branch net at the step S2204. Thus, the instance name of B1 and a pin name of IN are selected as objects to be traced at the step S2205. The instance name of B1 is stored along with an external interface signal named A at the step S2207. That is to say, the pair of [A, B1] is stored. The name of the gate with the instance name of B1 is BUF and, in accordance with the first line of the gate library 111, the type of the gate is BUFFER. Thus, the outcome of the judgment formed at the step S2208 indicates that the gate B1 is not a memory device. At the step S2209, a pin OUT of the gate B1 is known as a pin linked to the pin IN as is also obvious from the second line of the gate library 111 shown in FIG. 10. In accordance with the gate library 111 shown in FIG. 10, the gate B1 does not have other pins linked to the pin IN. Thus, the flow of the processing goes on from the step S2210 to the step S2211 at which the pin OUT of the gate B1 is selected as a pin to be traced. In accordance with FIG. 2, a net connected to the pin OUT is N1. Thus, the net N1 is selected as a next net to be traced. Since the direction attribute of the pin OUT is OUT, the direction attribute of the net N1 is set at IN at the step S2213. At the step S2204, the pin D of a memory device FF1 is found to be the only connection destination of the net N1. Thus, at the step S2205, a set of the instance name of FF1 and the pin name of D is selected as an object to be traced. At the step S2207, the instance name FF1 is stored along with the external interface signal A. That is to say, a set of [A, B1, FF1] is stored. The name of the gate with the instance name of FF1 is DFF. Thus, in accordance with the 14$^{th}$ line of the gate library 111 shown in FIG. 10, the type of the gate FF1 is FF. As a result, the gate FF1 is determined to be a memory device at the step S2208. Since the outcomes of the judgments formed at the steps S2214 and S2216 indicate that no data is cataloged on the net branch list and the pin branch list respectively, the trace processing of the external interface signal A is ended.

Next, (D, inout) is selected as an external interface signal at the step S2202. In the logic circuit 101 shown in FIG. 2, an external interface signal is given the same name as the net connected to the signal as described earlier. Thus, at the step S2203, a net treated as the net to be traced is D and the direction attribute is INOUT. Since the net B to be traced is connected to the IN pin of a gate B5 and the OUT pin of a gate B4, the net A is judged to be a branch net at the step S2204. The instance name of B5 and the pin name of IN are selected as objects to be traced. On the other hand, the instance name of B4 and the pin name of OUT are stored on a net branch list as (B4/OUT) at the step S2206. The selected instance name of B5 is stored along with an external interface signal named D at the step S2207 as a pair of [D, B5]. Since the name of the gate with the instance name of B5 is BUF, the outcome of the judgment formed at the step S2208 indicates that the gate B5 is not a memory device as is the case with the gate B1. At the step S2209, much like the gate B1, a pin OUT of the gate B5 is known as a pin linked to the pin IN as is also obvious from the second line of the gate library 111 shown in FIG. 10. Since the gate B1 does not have other pins linked to the pin IN, the flow of the processing goes on from the step S2210 to the step S2211 at which the pin OUT of the gate B5 is selected as a pin to be traced. In accordance with FIG. 2, a net connected to the pin OUT is N13. Thus, the net N13 is selected as a next net to be traced. Since the direction attribute of the pin OUT is OUT, the direction attribute of the net N13 is set at IN at the step S2213. At the step S2204, the pin D of a memory device FF4 is found to be the only connection destination of the net N13. Thus, at the step S2205, a set of the instance name of FF4 and the pin name of D is selected as an object to be traced. At the step S2207, the instance name FF4 is stored along with the external interface signal D. That is to say, a set of [D, B5, FF4] is stored. The name of the gate with the instance name of FF4 is DFF. Thus, much like the gate FF1, the type of the gate FF4 is FF. As a result, the gate FF4 is determined to be a memory device at the step S2208. Since (B4/OUT) is found cataloged on the net branch list as a connection destination at the step S2214, the instant name of B4 and the pin name of OUT are selected as a new set to be traced and (B4/OUT) is deleted from the net branch list at the step S2215. The selected instance name of B4 is stored along with the external interface signal D at the step S2207. That is to say, [D, B5, FF4, B4] is stored. The name of the gate with the instance name of B4 is TRI and, in accordance with the fifth line of the gate library 111 shown in FIG. 10, the type of the gate B4 is TRI-STATE-BUFFER. Thus, the outcome of the judgment formed at the step S2208 indicates that the gate B4 is not a memory device. At the step S2209, pins IN and EN of the gate B4 are known as pins linked to the pin OUT as is also obvious from the sixth and seventh lines of the gate library 111 shown in FIG. 10. Since the number of linked gate pins is 2 or more, the flow of the processing goes on from the step S2210 to the step S2212 at which the pin IN is selected and stored on the pin branch list along with the instant name of B4 as a set of {B4/IN}.

Connected to the pin IN of the gate B4, a net N18 is selected as a next net to be traced. Since the direction attribute of the pin IN of the gate B4 is IN, the direction attribute of the net N18 is set at OUT at the step S2213. At the step S2204, the pin O of a memory device FF6 is found to be the only connection destination of the net N18. Thus, at the step S2205, a set of the instance name of FF6 and the pin name of O is selected as an object to be traced. At the step S2207, the instance name FF6 is stored along with the external interface signal D. That is to say, a set of [D, B5, FF4, B4, FF6] is stored.

Much like the gates FF1 and FF4, the gate FF6 is determined to be a memory device at the step S2208. While the outcome of the judgment formed at the step S2214 indicates that the net branch list is empty, the outcome of the judgment formed at the step S2216 indicates that {B4/EN} is cataloged on the pin branch list. Thus, at the step S2217, a set of the instance name of B4 and the pin name of EN is selected as a pin to be traced. Connected to the pin EN of the gate B4 as shown in FIG. 2, a net N12 is selected as a next net to be traced. Since the direction attribute of the pin EN of the gate B4 is IN, the direction attribute of the net N12 is set at OUT at the step S2213. At the step S2204, the pin OUT of G3 and the pin IN2 of G4 are found to be connection destinations of the net N12. Since the direction attribute of the net N12 is OUT, however, only the pin OUT of G3 is regarded as the valid connection destination. Thus, at the step S2205, a set of the instance name of G3 and the pin name of OUT is selected as an object to be traced. At the step S2207, the instance name G3 is stored along with the external interface signal D. That is to say, a set of [D, B5, FF4, B4, FF6, G3] is stored.

Hereafter, processing is carried out in the same way and, eventually, a set of [D, B5, FF4, B4, FF6, G3, FF5, FF2] is stored.

After the processing of all external interface signals to be processed has been completed as described above, each combination of an external interface signal and instant names such as [A, B1, F1] or [D, B5, FF4, B4, FF6, G3, FF5, FF2] is output in a format shown in FIG. 11.

As described above, logic up to a first memory device reached by an external interface signal is traced and a file is generated and stored in a storage means such as the disc unit 2004. The file is used for generating a division initial state.

Next, the processing carried out at the step S2108 of the flowchart shown in FIG. 21 is explained by referring to a flowchart shown in FIG. 23. The flowchart shown in FIG. 23 begins with a step S2301 to form a judgment as to whether or not the net list 108 of the board exists. If the list does not exist, the flow of the processing goes on to a step S2302. Otherwise, the flow of the processing proceeds to a step S2303.

At the step S2302, processing is carried out to read in the connector-signal association list 115 shown in FIG. 13. Then, the flow of the processing goes on to a step S2306.

At the step S2303, processing is carried out to read in the board net list 108 shown in FIG. 7.

At a step S2304, processing is carried out to create a list of external interface signals of the logic circuit 101 on the board connected to the same part for each part on the basis of the board net list 108 read in at the step S2303. The file shown in FIG. 7 describes the board shown in FIG. 6 as a text. On the module TYPEA shown in FIG. 6, the logic circuit 101 is programmed by classifying the external interface signals A, B, C, D, E, F, G, H, I, J, K, L, M and CLK on the basis of a connection relation between the external interface signals A, B, C, D, E, F, G, H, I, J, K, L, M and CLK and parts LSIA, LSIB, CLKGEN and MEMORY of FIG. 6 available in the market. As a result, the part LSIA is combined with the external interface signals A, B, C, D and K whereas the part LSIB is combined with the external interface signals E, F, G, H, I and J. The part MEMORY is combined with the external interface signals L and M whereas the part CLKGEN is combined with the external interface signal CLK. The output of this processing is the external interface group list 110 shown in FIG. 9. On the external interface group list 110 shown in FIG. 9, symbols PG1, PG2, PG3 and PG4 are groups of external interface signals combined with the parts LSIA, MEMORY, LSIB and CLKGEN respectively.

At the next step S2305, processing is carried out to assign each group of external interface signals on the external interface group list 110 created at the step S2304 to a connector. If the number of connectors is greater than the number of groups to be assigned in the processing, each of the groups can be assigned arbitrarily to a connector different from a connector allocated to a different group. If the number of connectors is smaller than the number of groups to be assigned in the processing, on the other hand, the groups are sequentially assigned to different connectors, a group after another, with a group having a largest number of external interface signals taking precedence of the other groups. Since the number of connectors is smaller than the number of groups, the connectors with all pins thereof unassigned at all run out before all the groups are assigned. The unassigned groups are then assigned to connectors each having a large number of unused pins. The number of connectors and the number of pins in each connector can be known from the wire connection information file 103 read in at the step S2104. If the number of external interface signals in a group is greater than the number of unassigned pins in a connector, external interface signals unassignable to the connector are moved to another connector. In this case, external interface signals to be moved to another connector can be selected arbitrarily or selected by giving a priority to those with a low level of criticality.

In this example, let the groups PG1, PG2, PG3 and PG4 on the external interface group list 110 shown in FIG. 9 be assigned to CONNECTORα, CONNECTORβ and CONNECTORγ of the module shown in FIG. 3. First of all, in an order of decreasing external-interface-signal counts, the groups are listed as follows: PG3, PG1, PG2 and PG4. Then, PG3, PG1 and PG2 are assigned to CONNECTORγ, CONNECTORα and CONNECTORβ respectively. Subsequently, PG4 is assigned to CONNECTORβ which has the greatest number of unassigned pins. After all the external interface signals have been assigned to the connectors, the flow of the processing goes back to the step S2306.

At the step S2306, processing is carried out to assign external interface signals of the logic circuit 101 to connector pins directly connected to FPGAs by giving the highest priority to the external interface signal having the highest level of delay criticality described in the external interface priority specification file 114 input at the step S2106 on the basis of the connector-signal association list 115 read in at the step S2302 or results of the processing carried out at the step S2305. In this embodiment, the connector-signal association list 115 read in at the step S2302 describes results of the processing carried out at the step S2305. Thus, the connector-signal association list 115 read in at the step S2302 is used as the base of the processing carried out at the step S2306. The names of connector pins directly connected to FPGAs are acquired from the connector connection information file 105 extracted at the step S2105. In the case of the connector connection information file 105 shown in FIG. 8, for example, connector pins of CONNECTORα directly connected to FPGAs are C0, C1 and C2. Likewise, connector pins of CONNECTORβ directly connected to FPGAs are C0, C1 and C2. Similarly, connector pins of CONNECTORγ directly connected to FPGAs are C0, C1 and C2. An example of the external interface priority specification file 114 is shown in FIG. 12. Starting with an external interface signal having the highest priority as shown in FIG. 12, an external interface signal L of the logic circuit 101 is first selected. The part instance name of a connector for the external interface signal is found from the external interface priority specification file 114 to be CONNECTORβ. The external interface signal L is thus assigned to the pin C0 of CONNECTORβ. By the same token, the external interface signals M and K are assigned to the pin C1 of CONNECTORβ and the pin C0 of CONNECTORα respectively. When pins directly connected to FPGAs run out, another pin can be used. As an alternative, external interface signals are assigned to a connector name at a connector level to be assigned later to a pin of the connector by the module wire unit 124. Then, at a step S2307, results of the processing carried out at the step S2306 are stored in the connector-pin assignment result file 117. An example of the connector-pin assignment result file 117 is shown in FIG. 14.

As described above, when external interface signals have not been assigned to connectors in advance, the external interface signals can be assigned to connectors or even to connector pins by using information on connections and wires of parts on a board on which the module or an LSI under development is mounted. In this way, the operation to be carried out by the operator becomes simpler and an incorrect operation caused typically an input mistake can be avoided. As a result, the work efficiency of the logic emulation can be increased.

By referring to a flowchart shown in FIG. 24, the following description explains the processing to generate a division initial state carried out at the step S2110 of the flowchart shown in FIG. 21. The connector-pin assignment specification file 106 and the connector-pin assignment result file 117 used as inputs to this processing have equivalent information as is obvious from the examples shown in FIGS. 5 and 14. For this reason, the processing explained in following description uses the example shown in FIG. 14.

As shown in FIG. 24, the flowchart begins with a step S2401 at which an external interface signal of the logic circuit 101 is selected in accordance with the priority order described in the external interface priority specification file 114 input at the step S2106. Assume that the external interface priority specification file 114 shown in FIG. 12 is input. In this case, external interface signals are selected in the following order: L, M, K and A.

Then, the flow of the processing goes on to a step S2402 to form a judgment as to whether or not the external interface signal selected at the step 2401 passes through a wire directly connected to an FPGA on the basis of the connector-pin assignment specification file 106 or the connector-pin assignment result file 117 and the connector connection information file 105. If the external interface signal passes through such a wire, the flow of the processing goes on to a step S2403. Otherwise, the flow of the processing goes back to the step S2401 at which a next external interface signal is selected. In the case of the connector connection information file 105 shown in FIG. 8, for example, pins of CONNECTORα directly connected to FPGAs are C0, C1 and C2. Likewise, connector pins of CONNECTORβ directly connected to FPGAs are C0, C1 and C2. Similarly, connector pins of CONNECTORγ directly connected to FPGAs are C0, C1 and C2. As is obvious from the connector-pin assignment result file 117 shown in FIG. 14, external interface signals L, M, K, A, B, E, F and G are judged to be signals passing through wires directly connected to FPGAs. However, external interface signals D, C, H, I, J and CLK are judged to be signals not passing through wires directly connected to FPGAs.

Then, at a step S2403, a group of gates related to the selected external interface signal is selected by referring to the trace result file 113 shown in FIG. 11. Assume that the external interface signal L has been selected. In this case, gates associated with the external interface signal L are B13 and FF10 as is obvious from the trace result file 113. FIG. 11 also indicates that gates associated with the external interface signal B are B2, G16, G2 and FF2. It is also obvious from the trace result file 113 shown in FIG. 11 that gates associated with the external interface signal E are B6, G6, G7, G8, FF5, G16, G2 and FF2.

Then, at a step S2404, a gate is selected from the group of gates selected at the step S2403.

The flow of the processing then goes on to a step S2405 to form a judgment as to whether or not a gate selected at the step S2404 has been assigned to an FPGA. If the gate has been assigned to an FPGA, the flow of the processing goes on to a step S2407. Otherwise, the flow proceeds to a step S2406 at which the gate is assigned to an FPGA directly connected to a connector pin assigned to the external interface signal.

Unassigned to any FPGA, gates B13 and FF10 related to the external interface signal L are assigned to FPGAβ on the module shown in FIG. 3. It should be noted that an FPGA directly connected to a connector pin assigned to an external interface signal is obtained from the connector connection information file 105 and the connector-pin assignment specification file 106 or the connector-pin assignment result file 117. By the same token, unassigned to any FPGA, gates B2, G16, G2 and FF2 related to the external interface signal B are assigned to FPGAA on the module shown in FIG. 3. Likewise, unassigned to any FPGA, gates B6, G6, G7, G8 and FF5 related to the external interface signal E are assigned to FPGAY on the module shown in FIG. 3. Since gates G16, G2 and FF2 have been assigned to FPGAA, however, they are not assigned to FPGAY. The flow of the processing then continues to a step S2407 to form a judgment as to whether or not all gates in the group related to each external interface signal have been processed. If an unprocessed gate exists, the flow of the processing goes back to the step S2404. Otherwise, the flow of the processing goes on to a step S2408.

At the step S2408, the external interface signals are examined to form a judgment as to whether or not an unprocessed signal exists. If an unprocessed external interface signal exists, the flow of the processing goes back to the step S2401. Otherwise, the flow of the processing goes on to a step S2409. At the step S2409, results of assigning gates to FPGAs are output in the format of the division initial state file 118 shown in FIG. 15 and the processing is ended. It should be noted that the division initial state file 118 output by this processing is supplied to the processing carried out at the step S2111 of the flowchart shown in FIG. 21.

In this embodiment, it is only for external interface signals assigned to connector pins directly connected to FPGAs that groups of gates associated by the trace processing are assigned to the FPGAs directly connected to connector pins to which the external interface signals have been assigned. Also for external interface signals assigned to connector pins not directly connected to FPGAs, groups of gates associated by the trace processing are assigned to the same FPGAs. In this case, FPGAs to be assigned are selected arbitrarily.

By carrying out the processing as described above, the logic circuit 101 shown in FIG. 2 is divided, being targeted at the module shown in FIG. 3 on the basis of the connector-pin assignment specification file 106 shown in FIG. 5, the board net list 108 shown in FIG. 7 or the connector-signal association list 115 shown in FIG. 13 by division of logic taking connection between the logic and connectors into consideration, and assignments of gates to FPGAs are carried out in order to operate logic related to external interface signals at a high speed. In addition, delays are checked after the logic is divided to determine a priority order of interface signals between FPGAs. By doing wiring work for the module based on the inter-division-result interface priority order file 123 created in this processing, logic related to interface signals between FPGAs can be operated at a high speed.

What is claimed is:

1. A logic dividing method for dividing an electronic circuit of a logic apparatus into a plurality of groups and assigning said groups to a plurality of programmable logic devices, said logic dividing method comprising:

a first step of storing first information describing a relation between at least one connector for receiving and transmitting signals from and to said programmable logic devices and external interface signals input and output by said electronic circuit of said logic apparatus into a memory unit;

a second step of storing second information describing a relation between said external interface signals and logic of said electronic circuit of said logic apparatus using said external interface signals into said memory unit;

a third step of reading in information on connections between said connectors and said programmable logic devices from an information input unit; and a fourth step of generating division results of said electronic circuit of said logic apparatus assigning first logic using said external interface signal to said programmable logic device directly connected by a wire to one of said connectors assigned to said external interface signal on the basis of said first information, said second information and said information on connections and storing said results into said memory unit.

2. A logic dividing method according to claim 1 wherein said first step has the steps of:

storing information on a board for mounting said electronic circuit of said logic apparatus; and generating information on assignments of signal groups obtained as a result of grouping said external interface signals on the basis of input and output destinations to said connector from said information on said board and storing said information on assignments into said memory unit.

3. A logic dividing method according to claim 2, said method further having:

a fifth step of storing second connection information describing wire connections between said connector and said programmable logic device into said memory unit; and a sixth step of storing assignment priority information describing a priority order of said external interface signals into said memory unit, wherein said division results stored at said fourth step are division results showing wires connecting said programmable logic device to one of said connectors assigned to one of said signal groups having a high priority level in accordance with said second connection information and said assignment priority information.

4. A logic dividing method according to claim 1 wherein said second step has the steps of:

storing gate definition information in said memory unit;

driving a processing unit to trace a connection destination for each of said external interface signals on the basis of said gate definition information; and generating results of tracing said connection destination for each of said external interface signals and storing said results into said memory unit.

5. A logic dividing method according to claim 1, said method further having:

a fifth step of driving a processing unit to specify a priority order of nets passing through areas between said programmable logic devices; and an sixth step of driving said processing unit to assign wires between said programmable logic devices to said nets starting with one of said nets having a high priority level.

6. A logic dividing method according to claim 5 whereby, at said fifth step, said processing unit determines said priority order in accordance with delays of said external interface signals.

7. A logic dividing method according to claim 5 wherein said fifth step comprises the steps of:

storing delay limit information on delay value limits of said external interface signals into said memory unit;

storing delay definition information defining delays incurred in signal propagation for each gate employed in said electronic circuit of said logic apparatus into said memory unit; and driving a control means to set a priority order of said nets on the basis of said delay definition information, said delay limit information and said division results generated at said fourth step.

8. A logic dividing method for dividing an electronic circuit of a logic apparatus into a plurality of groups and assigning said groups to a plurality of programmable logic devices, said logic dividing method comprising the steps of:

storing connection information describing a relation associating external interface signals input and output by said electronic circuit of said logic apparatus with input and output destinations of said external interface signals into a memory unit;

storing connector information on a plurality of connectors for transferring signals exchanged with said programmable logic devices into said memory unit; and driving a processing unit to generate division results assigning signal groups obtained as a result of grouping said external interface signals in accordance with input and output destinations to some of said connectors on the basis of said connection information and said connector information and store said division results into said memory unit.

9. A logic dividing method for dividing an electronic circuit of a logic apparatus into a plurality of groups and assigning said groups to a plurality of programmable logic devices, said logic dividing method comprising the steps of:

driving a processing unit to specify a priority order of nets passing through areas between said programmable logic devices provided for division of logic; and driving said processing unit to assign wires between said programmable logic devices to external interface signals starting with one of said nets having a high priority on the basis of said priority order specified by said processing unit.

10. A logic dividing system for dividing an electronic circuit of a logic apparatus into a plurality of groups and assigning said groups to a plurality of programmable logic devices, said logic dividing system comprising a control means, a processing unit for carrying out division of logic and a memory unit for storing information required in said division of logic carried out by said processing unit, wherein:

said information stored in said memory unit comprises:

first information describing a relation between at least one connector for receiving and transmitting signals from and to said programmable logic devices and external interface signals input and output by said electronic circuit of said logic apparatus;

second information describing a relation between said external interface signals and logic of said electronic circuit of said logic apparatus using said external interface signals; and information on connections between said connectors and said programmable logic devices; and said control means generates division results of said electronic circuit of said logic apparatus assigning first logic using said external interface signal to said programmable logic device directly connected by a wire to one of said connectors assigned to said external interface signal on the basis of said first information, said second information and said information on connections and stores said results into said memory unit.

11. A logic dividing system according to claim 10 wherein said first information is information on assignments of signal groups obtained as a result of grouping said external interface signals on the basis of input and output destinations to said connectors; and said processing unit assigns said signal groups to said connectors on the basis of information on a board for mounting said electronic circuit of said logic apparatus.

12. A logic dividing system according to claim 11 wherein said processing unit stores second connection information describing wire connections between said connector and said programmable logic device and assignment priority information describing a priority order of said external interface signals into said memory unit; and as said division results, said processing unit generates division results showing wires connecting said programmable logic device to one of said connectors assigned to one of said signal groups having a high priority level in accordance with said second connection information and said assignment priority information.

13. A logic dividing system according to claim 10 wherein said processing unit:

stores gate definition information into said memory unit;

traces a connection destination for each of said external interface signals on the basis of said gate definition information; and generates results of tracing said connection destination for each of said external interface signals and stores said results into said memory unit.

14. A logic dividing system according to claim 10 wherein said processing unit assigns wires between said programmable logic devices to said nets starting with one of said nets with a high priority level on the basis of a priority order of nets passing through areas between said programmable logic devices.

15. A logic dividing system according to claim 14 wherein said processing unit determines said priority order in accordance with delays of said external interface signals.

16. A logic dividing system according to claim 14 wherein said memory unit is used for storing:

delay limit information on delay value limits of said external interface signals; and delay definition information defining delays incurred in signal propagation for each gate employed in said electronic circuit of said logic apparatus; and said processing unit sets a priority order of said nets on the basis of said delay definition information, said delay limit information and said division results.

17. A logic dividing system for dividing an electronic circuit of a logic apparatus into a plurality of groups and assigning said groups to a plurality of programmable logic devices, said logic dividing system comprising a processing unit for dividing logic and a memory unit for storing information required by said processing unit for dividing logic and said memory unit stores:

connection information describing a relation associating external interface signals input and output by said electronic circuit of said logic apparatus with input and output destinations of said external interface signals; and connector information on a plurality of connectors for transferring signals exchanged with said programmable logic devices, wherein said processing unit generates division results assigning signal groups obtained as a result of grouping said external interface signals in accordance with input and output destinations to some of said connectors on the basis of said connection information and said connector information and stores said division results into said memory unit.

18. A logic dividing system for dividing an electronic circuit of a logic apparatus into a plurality of groups and assigning said groups to a plurality of programmable logic devices, said logic dividing system comprising a processing unit for dividing logic and a memory unit for storing information required by said processing unit for dividing logic wherein said processing unit:

specifies a priority order of nets passing through areas between said programmable logic devices provided for division of logic; and assigns wires between said programmable logic devices to external interface signals starting with one of said nets having a high priority on the basis of said priority order specified by said processing unit.

19. A recording medium for storing a logic dividing program readable by a computer for execution to divide an electronic circuit of a logic apparatus into a plurality of groups and assign said groups to a plurality of programmable logic devices, said logic dividing program comprising:

a first step of storing first information describing a relation between at least one connector for receiving and transmitting signals from and to said programmable logic devices and external interface signals input and output by said electronic circuit of said logic apparatus into a memory unit;

a second step of storing second information describing a relation between said external interface signals and logic of said electronic circuit of said logic apparatus using said external interface signals into said memory unit;

a third step of reading in information on connections between said connectors and said programmable logic devices from an information input unit; and a fourth step of generating division results of said electronic circuit of said logic apparatus assigning first logic using said external interface signal to said programmable logic device directly connected by a wire to one of said connectors assigned to said external interface signal on the basis of said first information, said second information and said information on connections and storing said results into said memory unit.

20. A recording medium for storing a logic dividing program readable by a computer according to claim 19 wherein said first step has the steps of:

storing information on a board for mounting said electronic circuit of said logic apparatus; and generating information on assignments of signal groups obtained as a result of grouping said external interface signals on the basis of input and output destinations to said connector from said information on said board and storing said information on assignments into said memory unit.

21. A recording medium for storing a logic dividing program readable by a computer according to claim 20, said program further having:

a fifth step of storing second connection information describing wire connections between said connector and said programmable logic device into said memory unit; and a sixth step of storing assignment priority information describing a priority order of said external interface signals into said memory unit, wherein said division results stored at said fourth step are division results showing wires connecting said programmable logic device to one of said connectors assigned to one of said signal groups having a high priority level in accordance with said second connection information and said assignment priority information.

22. A recording medium for storing a logic dividing program readable by a computer according to claim 19 wherein said second step has the steps of:

storing gate definition information in said memory unit;

driving a processing unit to trace a connection destination for each of said external interface signals on the basis of said gate definition information; and generating results of tracing said connection destination for each of said external interface signals and storing said results into said memory unit.

23. A recording medium for storing a logic dividing program readable by a computer according to claim 19, said program further having:

a fifth step of driving a processing unit to specify a priority order of nets passing through areas between said programmable logic devices; and an sixth step of driving said processing unit to assign wires between said programmable logic devices to said nets starting with one of said nets with a high priority level.

24. A recording medium for storing a logic dividing program readable by a computer according to claim 23 whereby, at said fifth step, said processing unit determines said priority order in accordance with delays of said external interface signals.

25. A recording medium for storing a logic dividing program readable by a computer according to claim 23 wherein said fifth step comprises the steps of:

storing delay limit information on delay value limits of said external interface signals into said memory unit;

storing delay definition information defining delays incurred in signal propagation for each gate employed in said electronic circuit of said logic apparatus into said memory unit; and driving a control means to set a priority order of said nets on the basis of said delay definition information, said delay limit information and said division results generated at said fourth step.

26. A recording medium for storing a logic dividing program readable by a computer for execution to divide an electronic circuit of a logic apparatus into a plurality of groups and assign said groups to a plurality of programmable logic devices, said logic dividing program comprising the steps of:

storing connection information describing a relation associating external interface signals input and output by said electronic circuit of said logic apparatus with input and output destinations of said external interface signals into a memory unit;

storing connector information on a plurality of connectors for transferring signals exchanged with programmable logic devices into said memory unit; and driving a processing unit to generate division results assigning signal groups obtained as a result of grouping said external interface signals in accordance with input and output destinations to some of said connectors on the basis of said connection information and said connector information and store said division results into said memory unit.

27. A recording medium for storing a logic dividing program readable by a computer for execution to divide an electronic circuit of a logic apparatus into a plurality of groups and assign said groups to a plurality of programmable logic devices, said logic dividing program comprising the steps of:

driving a processing unit to specify a priority order of nets passing through areas between said programmable logic devices provided for division of logic; and driving said processing unit to assign wires between said programmable logic devices to external interface signals starting with one of said nets having a high priority on the basis of said priority order specified by said processing unit.

* * * * *